United States Patent
Dugger et al.

(10) Patent No.: US 6,898,097 B2
(45) Date of Patent: May 24, 2005

(54) FLOATING-GATE ANALOG CIRCUIT

(75) Inventors: Jeffery Don Dugger, Atlanta, GA (US);
Tyson S. Hall, Cleveland, TN (US);
Paul Hasler, Atlanta, GA (US); David V. Anderson, Alpharetta, GA (US);
Paul D. Smith, Marietta, GA (US);
Matthew Raymond Kucic, Austell, GA (US); Abhishek Bandyopadhyay, Atlanta, GA (US)

(73) Assignee: Georgia Tech Research Corp., Atlanta, GA (US)

( * ) Notice: Subject to any disclaimer, the term of this patent is extended or adjusted under 35 U.S.C. 154(b) by 93 days.

(21) Appl. No.: 10/397,021

(22) Filed: Mar. 24, 2003

(65) Prior Publication Data

US 2003/0183871 A1 Oct. 2, 2003

Related U.S. Application Data

(60) Provisional application No. 60/366,714, filed on Mar. 22, 2002.

(51) Int. Cl.[7] ............................................. G11C 27/00
(52) U.S. Cl. ............... 365/45; 365/185.03; 365/185.11; 326/37; 326/39
(58) Field of Search ............................. 365/45, 185.03, 365/185.11; 326/37, 39

(56) References Cited

U.S. PATENT DOCUMENTS

| | | | | |
|---|---|---|---|---|
| 4,631,400 A | * | 12/1986 | Tanner et al. ............... | 250/221 |
| 5,289,401 A | * | 2/1994 | Shima ......................... | 365/45 |
| 5,343,555 A | * | 8/1994 | Yayla et al. .................. | 706/35 |
| 5,537,512 A | * | 7/1996 | Hsia et al. .................... | 706/39 |
| 5,914,894 A | * | 6/1999 | Diorio et al. ............ | 365/185.03 |
| 5,986,927 A | * | 11/1999 | Minch et al. ........... | 365/185.01 |
| 5,990,512 A | * | 11/1999 | Diorio et al. ............... | 257/314 |
| 2002/0011869 A1 | | 1/2002 | Bradl et al. .................... | 326/37 |

OTHER PUBLICATIONS

Matt Kucic, AiChen Low, Paul Hasler, "A Programmable Continuous–Time Floating–Gate Fourier Processor," IEEE Transactions on Circuits and Systems—II Analog and Digital Signal Processing, vol. 48, No. 1, Jan. 2001, pp. 90–99.

Matt Kucic, Aichen Low, Paul Hasler, "A Programmable Continuous–Time Analog Fourier Processor Based on Floating–Gate Devices," IEEE International Symposium on Circuits and Systems, May 28–31, 2000, pp. 351–354.

* cited by examiner

*Primary Examiner*—Van Thu Nguyen
*Assistant Examiner*—J. H. Hur
(74) *Attorney, Agent, or Firm*—Thomas, Kayden, Horstemeyer & Risley, LLP

(57) ABSTRACT

In one exemplary embodiment, a programmable analog array (PAA) contains a configurable analog matrix having two floating-gate field effect transistors (FETs). Also contained in the PAA is an interconnect circuit that is programmable to configure the configurable analog matrix to operate in one or more of several matrix modes. A few examples of such matrix modes include a switching matrix mode, a memory matrix mode, and a computing matrix mode. In an exemplary method of configuring the PAA. PAA, the the method includes programming an interconnection, for example, between a first terminal of the first floating-gate FET and a first terminal of the second floating-gate FET. The method further includes programming an interconnection, for example, between a gate terminal of the first floating-gate FET and a fixed voltage source, for setting a floating gate charge on the first floating-gate FET.

19 Claims, 21 Drawing Sheets

FLOATING-GATE ANALOG CIRCUIT

CROSS REFERENCE TO RELATED APPLICATIONS

This application claims the benefit of U.S. Provisional Patent Application Ser. No. 60/366,714 filed Mar. 22, 2002, which is incorporated herein by reference in its entirety.

STATEMENT REGARDING FEDERALLY SPONSORED RESEARCH OR DEVELOPMENT

The U.S. government may have a paid-up license in this invention and the right in limited circumstances to require the patent owner to license others on reasonable terms as provided for by the terms of Grant No. EIA-0083 172 awarded by the National Science Foundation of the U.S.

FIELD OF THE INVENTION

The present invention generally relates to the field of analog circuits. More specifically it relates to programmable analog arrays that can be programmed at a transistor level.

BACKGROUND AND PRIOR ART

Hardware design of a digital logic circuit is often initiated by evaluating a prototype circuit that is programmed into a reconfigurable device such as a field programmable gate array (FPGA) or a programmable logic device (PLD). While this design approach has certain handicaps related to cost and optimal usage of logic elements, the advantages provided in using programmable devices for digital design has proved far more attractive and has been used by engineers for many years. To a large extent, the advantage of a digital programmable device lies in its flexibility to permit interconnection changes to be carried out at a primitive level that often extends down to the level of a logic gate, such as a NAND or an OR gate. This feature allows engineers to design and evaluate a wide variety of logic circuits using a single FPGA. In many situations, this level of design flexibility down to a logic gate is unnecessary. For example, certain standard circuit configurations such as flip-flops, counters and registers can be pre-designed into an FPGA thereby freeing the designer of the task and/or skills needed to implement such mundane functions. These pre-designed circuits are typically referred to as macros, and such macros have been incorporated into several FPGAs, often in conjunction with logic gate primitives that are also available for the digital designer.

While not necessarily referred to as macros, digital memories have also been incorporated into several FPGAs albeit to a limited extent dictated by market needs and costs. Digital memories as standalone devices have proven to provide a large degree of circuit density at relatively low costs, and hence are often used as independent integrated circuit packages located external to an FPGA package.

Unlike digital hardware design, analog hardware design involves a different set of requirements that are unique to analog circuits. Such requirements include interconnecting several discrete components such as transistors, resistors, and capacitors to form a circuit with minimal parasitic parameters so as to obtain maximum bandwidth response. These discrete components have to be selected from a wide variety of component values. For example, the value of a resistor for one circuit may be 100 ohms, while for a second circuit it may be 1.45 kilo ohms. Accommodating such a variety of values in such a variety of discrete components, to cater to flexible design of analog circuits inside a programmable/reconfigurable integrated circuit is a challenging task. This condition has led to limited implementations of programmable devices in the analog domain. One such device is termed a field programmable analog array (FPAA).

Various manufacturers have sought a convenient compromise by providing pre-configured circuits inside FPAAs akin to FPGA macros. Such pre-configured circuits include op amps, filters, and oscillators. This approach has several advantages in terms of optimizing space inside integrated circuits, providing good circuit performance due to optimal layout, and allowing engineers who are relatively unskilled in analog circuit design to incorporate analog circuits into their designs by using interconnections that can be configured by programming the FPAA.

On the other hand, this approach has proved very limiting to analog designers desirous of using an FPAA to create a design at a primitive level extending down to a transistor. Some manufacturers have sought to address this limitation by providing transistors, sometimes in array configurations, that can be programmably interconnected to each other together with some discrete analog elements such as resistors, that are also incorporated into an FPAA. The choice of the type of transistors and their performance parameters is often a compromise that is driven by the market and is often constrained by semiconductor integration technology.

While digital memory devices are very popular and widely available, analog memory devices are relatively obscure and are limited in their performance. Some manufacturers have utilized charge-storing elements such as capacitors that are configured as arrays. The charge-levels inside the capacitors are often digital in nature where certain charge-thresholds are utilized to represent binary as well as multi-level digital values. Typically, analog memory devices have been manufactured as standalone devices, and where integrated into FPAAs have provided limited performance characteristics.

It is therefore desirable to provide a programmable analog device that incorporates analog memory elements as well as discrete analog elements, specifically transistors, with maximum interconnect flexibility, programmable design parameters and optimal circuit density. It is even more desirable to integrate memory functionality together with transistor computational functionality inside a single common element. When such a common element, for example a transistor element that has analog storage capacity, is used independently or interconnected with other transistor elements inside the FPAA, the resulting configuration can provide computing as well as memory functions in a compact package. It is also desirable that various operating parameters of the transistor element, such as voltage bias, current flow, gain, and analog memory values may also be programmable. This feature will provide a level of programmability that extends beyond traditional FPAAs where the design engineer typically programs the interconnections inside the FPAA to create an analog circuit, but is unable to further program other circuit parameters, such as the operating parameters of a transistor contained in the analog circuit.

SUMMARY OF THE INVENTION

The present invention provides methods and systems for configuring a floating-gate transistor device to perform a computational function upon an input signal that is coupled into a floating-gate of the floating gate field-effect transistor, wherein the computational function is dependent upon a charge that is programmed into the floating-gate of the floating-gate field effect transistor. Also provided is a configuration circuit that is used to configure circuit parameters of the floating gate field-effect transistor in order to perform the computational function.

Another embodiment can be described as a method of using a floating-gate pFET as a computation device, the method comprising coupling an input signal into a floating-gate of the floating-gate pFET, and providing a charge at the floating-gate of the floating-gate pFET in order to produce an output signal that is a mathematical combination of the input signal and a weight that is proportional to the charge at the floating-gate.

DESCRIPTION OF THE DRAWINGS

Many aspects of the invention can be better understood with reference to the following drawings. The components in the drawings are not necessarily drawn to scale, emphasis instead being placed upon clearly illustrating the principles of the present invention. Moreover, in the drawings, like reference numerals designate corresponding parts throughout the several views.

DETAILED DESCRIPTION OF THE PREFERRED EMBODIMENTS

While the description below refers to certain exemplary embodiments, it is to be understood that the invention is not limited to these particular embodiments. On the contrary, the intent is to cover all alternatives, modifications and equivalents included within the spirit and scope of the invention as defined by the appended claims. Also, the terminology used herein is for the purpose of description and not of limitation.

The description of several components of this invention has been carried out using figures drawn in a hierarchical fashion, wherein each progressive figure provides greater details of a component than was provided in an earlier figure.

Figure 1:
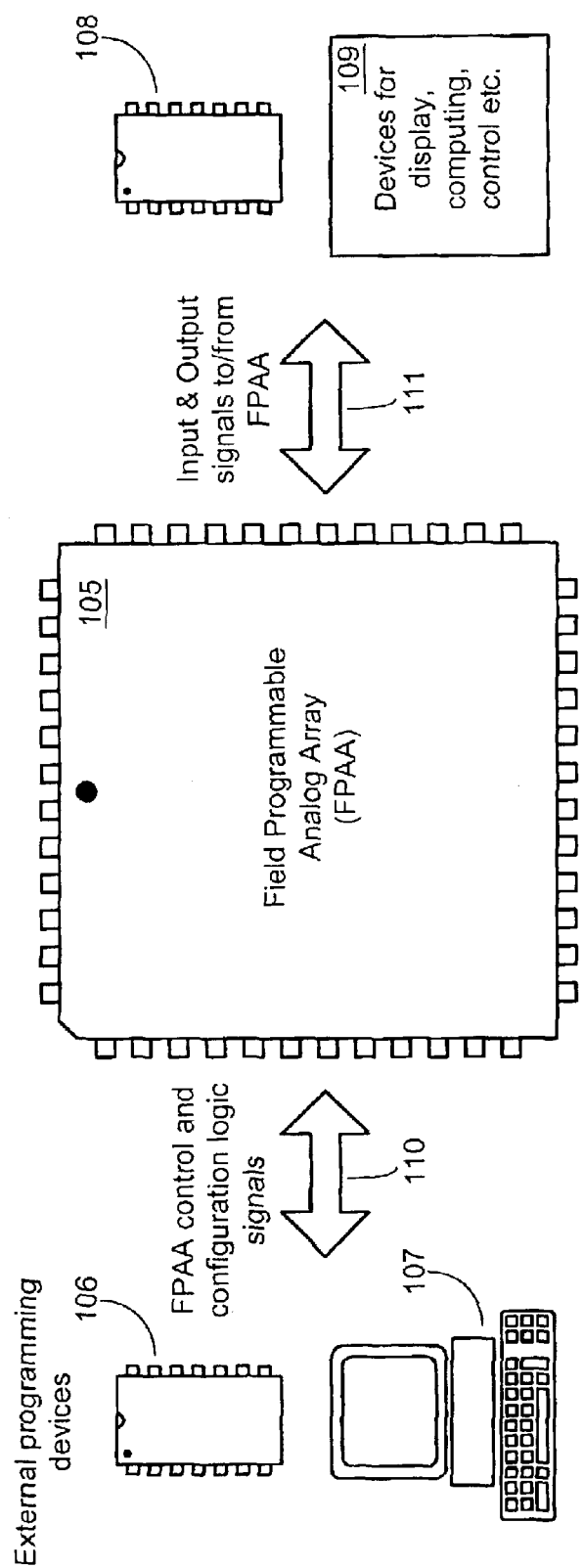
FIG. 1 illustrates a field programmable analog array (FPAA) incorporating the invention, implemented in an exemplary integrated circuit package that is programmable using one or more external programming devices.

FIG. 1 illustrates a field programmable analog array (FPAA) 105 incorporating the invention, implemented in an exemplary integrated circuit package that is programmable using one or more external programming devices such as programming devices 106 and 107. Programming device 106 is an integrated circuit, which for example, may be a digital memory IC containing FPAA control and configuration logic in the form of a software or firmware program that can be communicated to FPAA 105 via link 110. Programming device 107 is a computing device, such as a PC, a microcontroller circuit, a microprocessor circuit, or a dedicated control logic circuit that can be used alternatively to provide control and configuration logic to FPAA 105 via link 110.

The term FPAA control and configuration logic as used above, encompasses several control and programming parameters, such as schematic capture, boolean equation entry, and hardware description languages. Examples of hardware description languages include Verilog and very high speed integrated circuits (VHSIC) hardware description language (VHDL).

FPAA 105 communicates its input/output (i/o) signals, which may be analog as well as digital signals, to one or more external devices such as devices 108 and 109. The analog signals are carried over analog links contained inside link 111, while the digital signals are carried over digital links contained inside link 111. Device 108 is an integrated circuit that receives and/or transmits analog and/or digital signals from FPAA 105, and further processes these signals if necessary. Device 108 (as well as device 106) may be located on the same printed circuit board that houses FPAA 105. The symbolic representation of device 109 as shown in FIG. 1, is intended to encompass a variety of display, computing, and/or control devices. Such devices include output devices, for example light emitting diodes, PC monitors, transmitters, receivers, and electric motors; and input/output devices such as PCs, microcontrollers, and control circuits.

In digital applications, the process of programming a programmable digital device such as an FPGA or a PLD, is traditionally performed to implement pre-determined interconnections between various logic elements inside the device. This approach is also typically used in analog applications to program conventional FPAAs. Unlike these traditional processes, that are limited to implementing interconnections between elements inside programmable devices FPAA 105 not only permits setting up interconnections between elements, but additionally permits programming one or more device and/or circuit parameters inside FPAA 105 to enable analog circuit operation in several alternative modes.

It must be pointed out, that even though FIG. 1 shows link 110 and the two programming devices 106 and 107 located external to FPAA 105, it will be obvious to persons of ordinary skill in the art that many functions of these elements can be incorporated into FPAA 105 if so desired.

Figure 2:
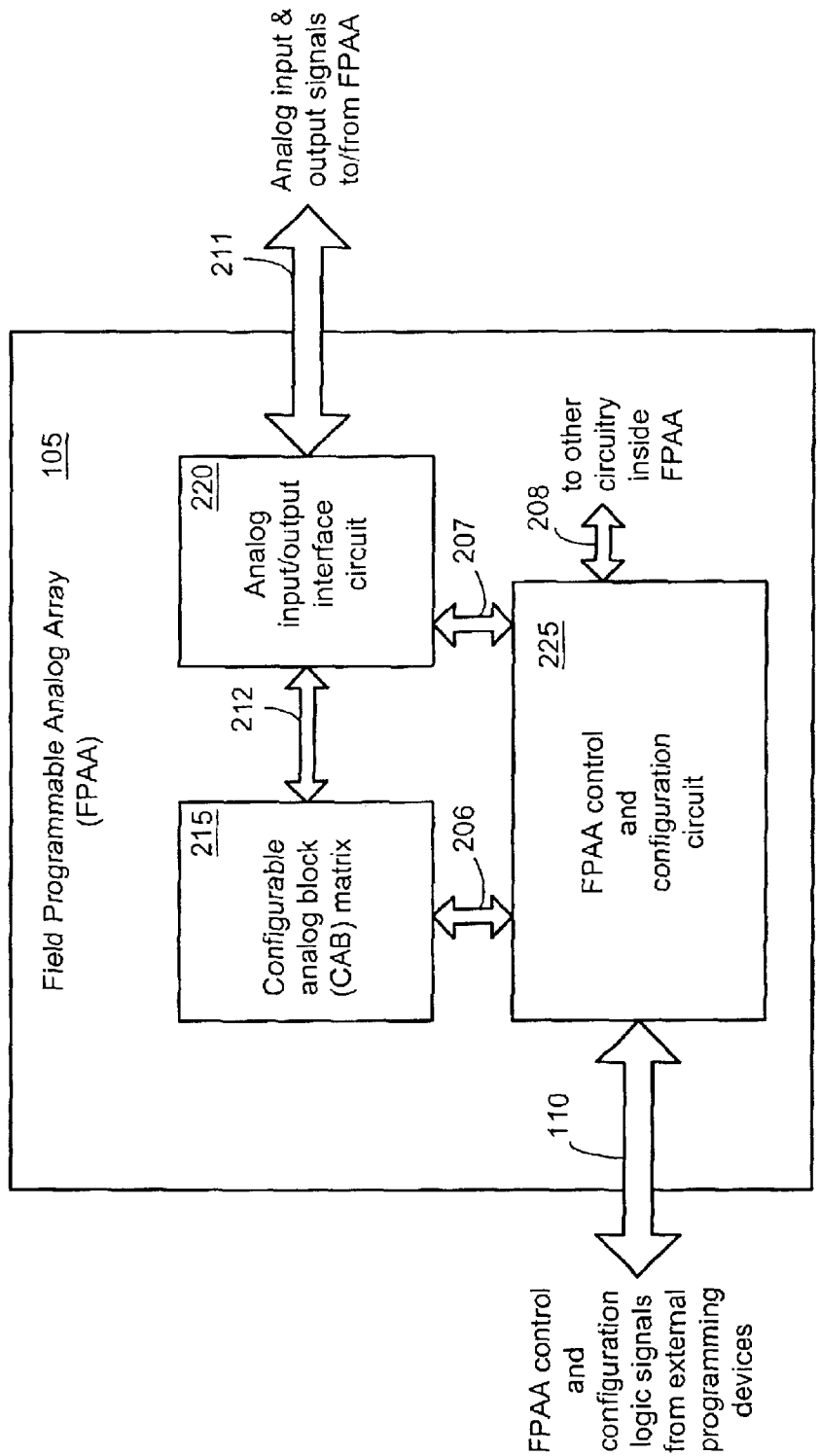
FIG. 2 shows the main functional blocks of the invention housed inside the FPAA of FIG. 1.

FIG. 2 shows the main functional blocks of the invention housed inside FPAA 105 of FIG. 1. These blocks include a configurable analog block (CAB) matrix 215, an analog input/output interface circuit 220, and an FPAA control and configuration circuit 225. Configurable analog block (CAB) matrix 215 is connected to the analog input/output interface circuit 220 via link 212, and to FPAA control and configuration circuit 225 via link 206. FPAA control and configuration circuit 225 is connected to the analog input/output circuit 220 via link 207, and to external programming devices via link 110.

FPAA control and configuration circuit 225 uses link 206 to program the interconnections as well as configure circuit parameters of the analog circuit elements contained in configurable analog block (CAB) matrix 215. The configurable analog block (CAB) matrix 215 will be explained in further detail using FIG. 4 and other figures.

In certain applications, FPAA control and configuration circuit 225 may use link 207 to program the interconnections and operating parameters of the i/o devices contained inside analog input/output circuit 220. Programming interconnections includes, for example, setting up an interconnection between the output terminal of a line driver and an output pin of FPAA 105, after selecting a suitable line driver and a suitable output pin. The selection of the line driver as well as the output pin may be manually carried out by an operator, or may be automatically performed by the program. Setting up operating parameters includes, for example, setting the gain, the output drive current, the input sensitivity, and/or the bandwidth of op amps that have been configured as either receivers or drivers connected to i/o pins.

Link 208 from FPAA control and configuration circuit 225 may be used to set up interconnections for other circuitry, such as digital logic circuits that may be optionally housed inside FPAA 105.

Analog input/output interface circuit 220 may incorporate several devices such as analog op amps, comparators, input receivers, and line drivers that couple analog signals into link 211. Link 211 represents the analog links contained inside link 111 shown in FIG. 1. Analog input/output interface circuit 220 may also include other interface devices such as an analog-to-digital converter that may be used to transmit a signal out of FPAA 105, or a digital-to-analog converter that may be used to receive a signal into FPAA 105.

Interconnect circuit 320 performs several functions, two of which are exemplified by the blocks drawn in dashed lines. The contents of these blocks will be described in more detail using other figures. "Programmable hardware for implementing circuit interconnections" block 301 may be used for example, to route signals from FPAA control and configuration circuit 225 (shown in FIG. 2) to set up interconnections between elements that are located inside each of the individual CAB blocks. It may also be used, under program control of the FPAA control and configuration circuit 225, to provide interconnections for one or more signals from one CAB to another through links 319, 320, 321 and 322. "Programmable hardware for setting up circuit parameters" block 302, may be used under program control of the FPAA control and configuration circuit 225, to configure for example, the circuit parameters of various elements, digital as well as analog, located inside one or more CABs.

Figure 3:
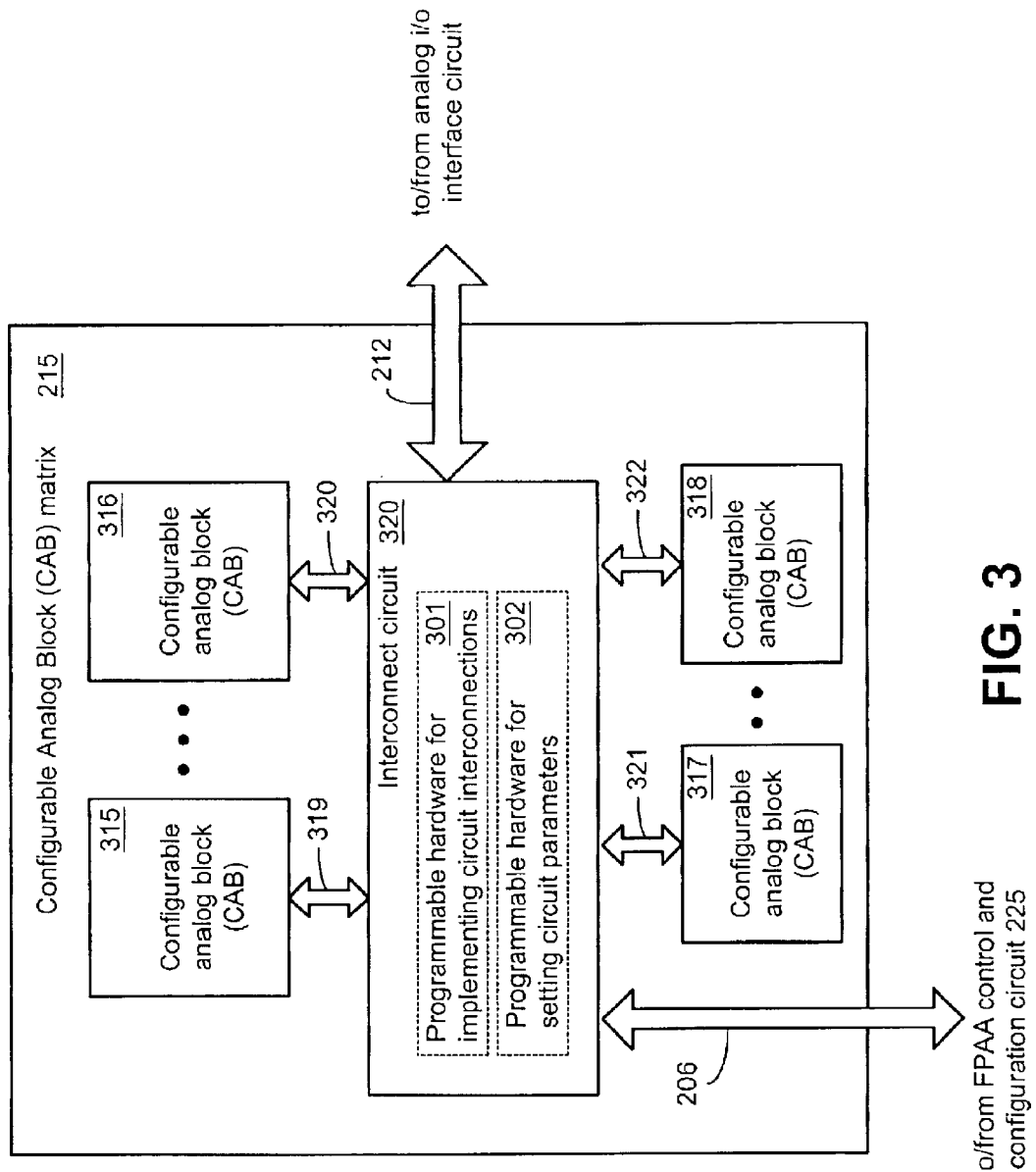
FIG. 3 shows some functional blocks inside one of the main functional blocks, the CAB matrix, of FIG. 1.
Figure 4:
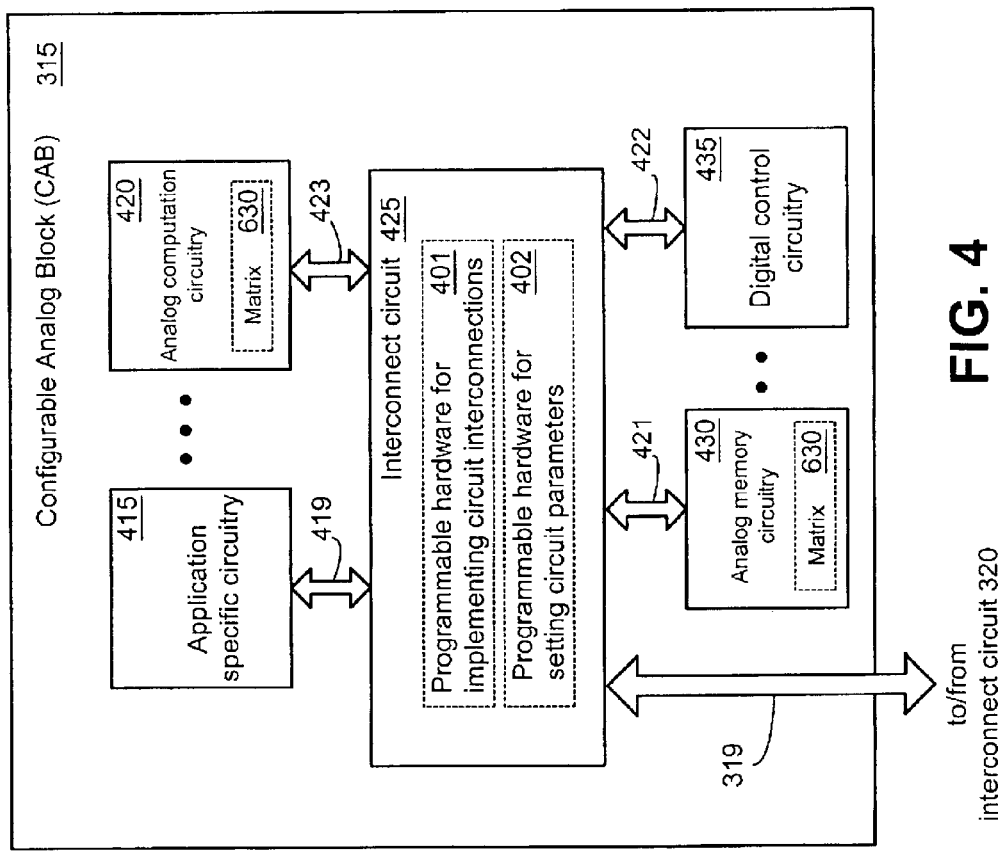
FIG. 4 shows some functional blocks inside a CAB circuit that is contained in the CAB matrix of FIG. 3.

FIG. 4 shows the functional blocks inside CAB 315 of FIG. 3. Application specific circuitry 415, analog computation circuitry 420, analog memory circuitry 430, and digital control circuitry 435 that are connected to interconnect circuit 425 via links 419, 423, 421, and 422, are four examples of functional blocks that may be contained in CAB 315. It must be pointed out that though shown as distinctly functional blocks, several functions such as computation and memory, may be jointly performed by a common element, and therefore may be incorporated into a common block. For example, blocks 420 and 430 may in some instances, be replaced by one common block that performs both functions concurrently. Similarly, the digital control circuitry block may also be merged into other blocks or may be eliminated altogether in certain cases.

Application specific circuitry 415 contains pre-configured circuits—analog and/or digital, that can be used independently or in conjunction with elements located inside other blocks of CAB 315. Analog computation circuitry 420 contains computing elements; while analog memory circuitry 430 contains analog memory elements. Both these blocks show a matrix block 630 which will be explained in detail using other figures.

Digital control circuitry 435 is an optional block that may be used in conjunction with digital circuits located inside application specific circuitry 415. One example of such a circuit housed in the digital control circuitry 435 is a state-machine program to operate a digital circuit located in application specific circuitry 415.

Interconnect circuit 425 performs several functions in manner similar to that performed by the interconnect circuit 325 of FIG. 3. For example, it may provide interconnection for one or more signals from the application specific circuitry 415 to the analog computation circuitry 420 using links 419 and 423. Similar interconnections can also be provided to other blocks of CAB 315, using links 421 and 422. Interconnect circuit 425 also permits routing of control signals used to configure the interconnectivity of elements inside the various blocks. For example, it can be used to configure the connections of analog elements in the analog computation circuitry 420.

Interconnect circuit 425 is also used to route signals that are used to set up operating parameters of analog circuits inside, for example, analog memory circuit 430. Such signals may, for example, be analog voltages and/or analog currents. It will be understood that interconnection circuit 425 of FIG. 4 and interconnection circuit 320 of FIG. 3 are shown as two distinct blocks for illustration purposes only. In many applications, these two blocks will be implemented in an integrated manner at predefined locations inside an FPAA.

Figure 5:
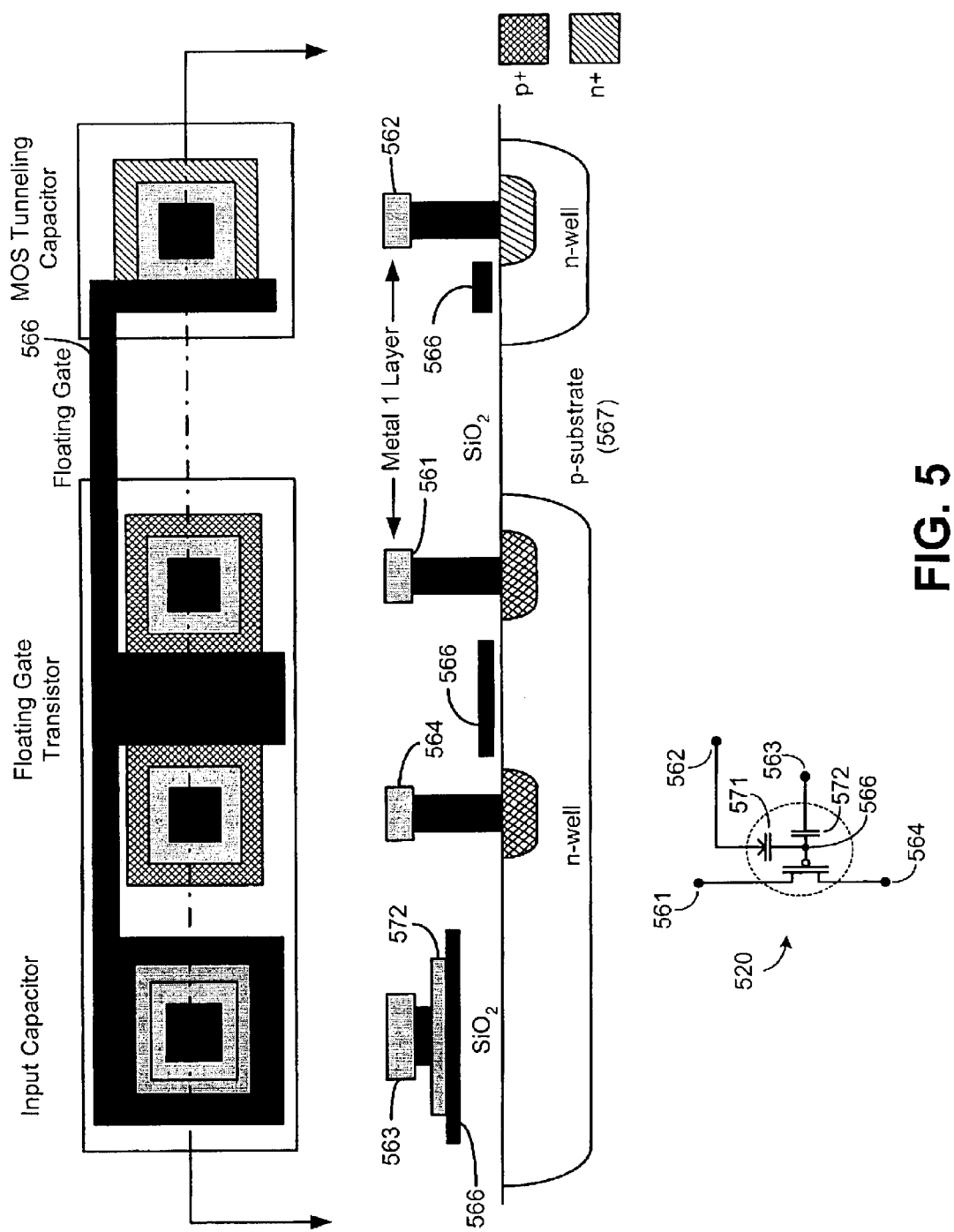
FIG. 5 shows the layout, cross-section, and circuit symbol of a floating-date pFET, one of several MOSFETS that may be used to form a matrix block contained inside the CAB circuit of FIG. 4.

FIG. 5 shows the layout, cross-section, and circuit symbol of a floating-date pFET, one of several MOSFETS and other types of floating-date transistors that can be used to form the matrix 630 block shown inside analog computation circuitry 420 and analog memory circuitry 430 of FIG. 4. A floating gate transistor is so named because it incorporates a floating gate that is a polysilicon gate surrounded by $SiO_2$. When an inherent or externally-injected charge is present on the floating gate, the charge is stored permanently because the floating gate is completely surrounded by an insulator. This property of a floating gate transistor permits its use as an analog memory element wherein the stored charge constitutes the contents of the analog memory.

Additionally, the charge on the floating gate can be also used to control the source-drain current flow in the floating-gate transistor, because the floating gate charge acts as a gate bias-voltage. This current-control property can be used in creating circuits for various computing functions such as switching, multiplication, and addition. The property also provides linear and non-linear signal transformation characteristics for the floating-gate transistor that can be exploited in several applications.

Drawing attention to FIG. 5, signals on the floating gate terminal 563, as well as the source and drain terminals 561 and 564 of pFET 520 capacitively couple into channel 567 by way of the floating gate 566. The current through channel 567 is dependent on the charge at the floating gate 566. To add charge, Fowler-Nordheim tunneling may be used to tunnel electrons off the floating gate. This tunneling is carried out via tunneling capacitor 571. To remove charge, hot-electron injection may be used. While increasing charge at the floating gate 566 causes the channel current to decrease, decreasing charge at the floating gate causes the channel current to increase.

By controlling the amount of charge present at the floating gate 566, floating-gate pFET 520 can be configured to operate as a switch, with "saturated" current flow between drain and source producing a switch ON condition, while current flow blockage between drain and source producing a switch OFF condition. pFET 520 can also be configured to operate in a partially-conducting mode, by suitably adjusting the amount of charge present at the floating gate 566.

Figure 6:
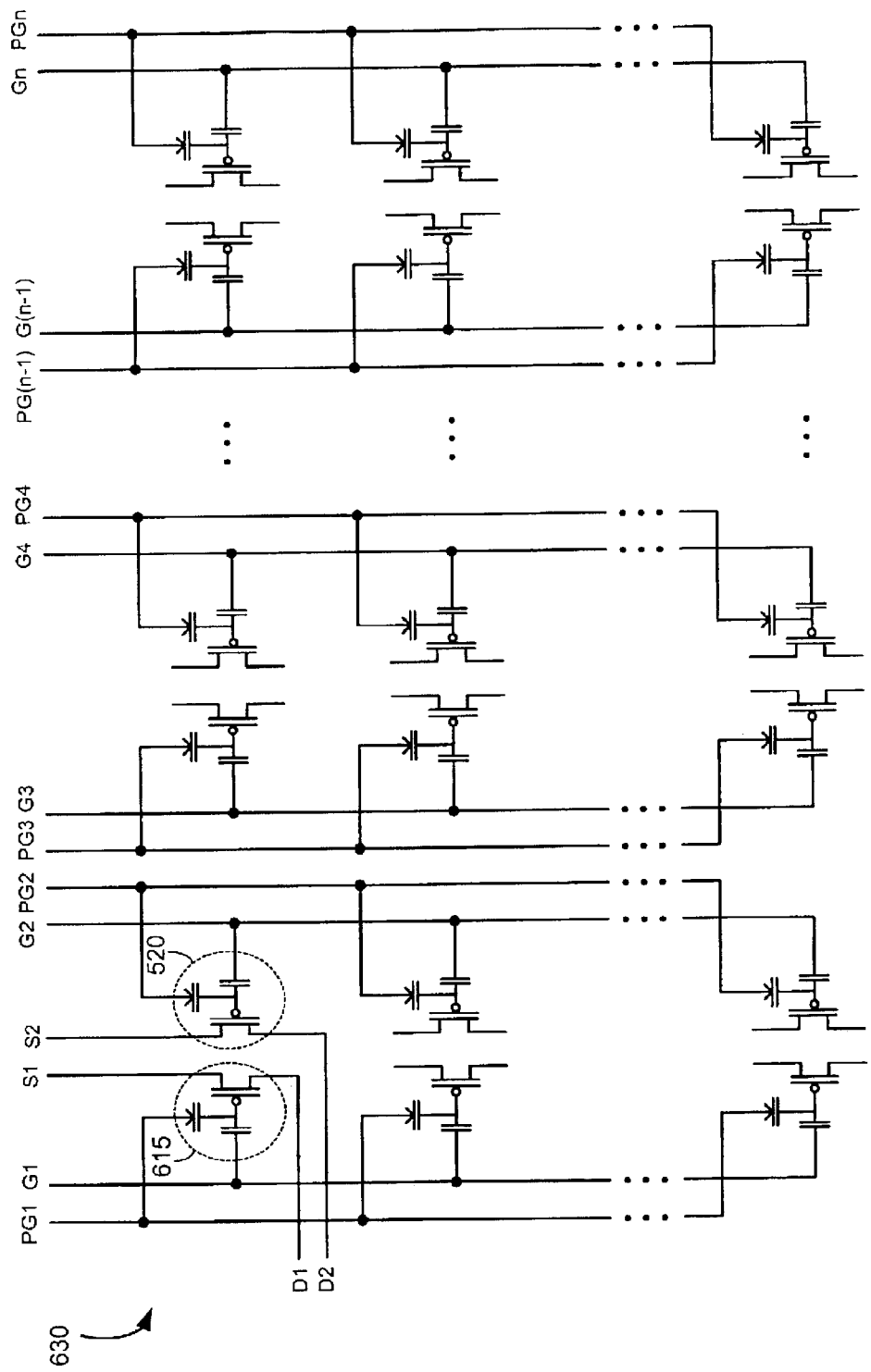
FIG. 6 shows a matrix circuit that is formed using the floating-date pFET of FIG. 5.

Drawing attention to FIG. 6, which incorporates floating-gate pFET 520 as a nodal element, it can be seen that such floating-gate pFETs can be arranged in the form of a matrix 630. Matrix 630 can be programmed to operate in several modes. Examples of some modes include operation as a switching matrix, a memory matrix, and a computing matrix.

FPAA control and configuration circuit 225 (shown in FIG. 2) is used together with interconnect circuit 320 (shown in FIG. 3) and interconnect circuit 425 (shown in FIG. 4) to provide the configuration logic to program matrix 630 for operating in a desired mode.

In general, the programming operation involves setting up interconnections in matrix 630, followed by programming each nodal element to operate in an appropriate mode. For example, if matrix 630 has to be programmed as a switching matrix, the gate, source, and drain terminals of the various pFETs can be suitably interconnected to each other (interconnection not shown) followed by programming of each nodal element, such as pFET 520, to operate as a switching element. Typically, programming pFET 520 as a switching element may involve adjusting the charge at the floating gate to cause the pFET to operate in either an ON or an OFF condition. The analog voltages and/or currents needed to perform the charge adjustment will be provided and/or controlled by the FPAA control and configuration circuit 225 (shown in FIG. 2) in conjunction with interconnect circuit 320 (shown in FIG. 3) and interconnect circuit 425 (shown in FIG. 4). It will be understood that in a typical application this charge adjustment has to be done on each of the pFETs individually. The charge adjustment, which is done to enable certain pFETs as ON switches and others as OFF switches, may be carried out at one instance in time or may be carried out at regularly or irregularly selected instances in time.

Figure 7A:
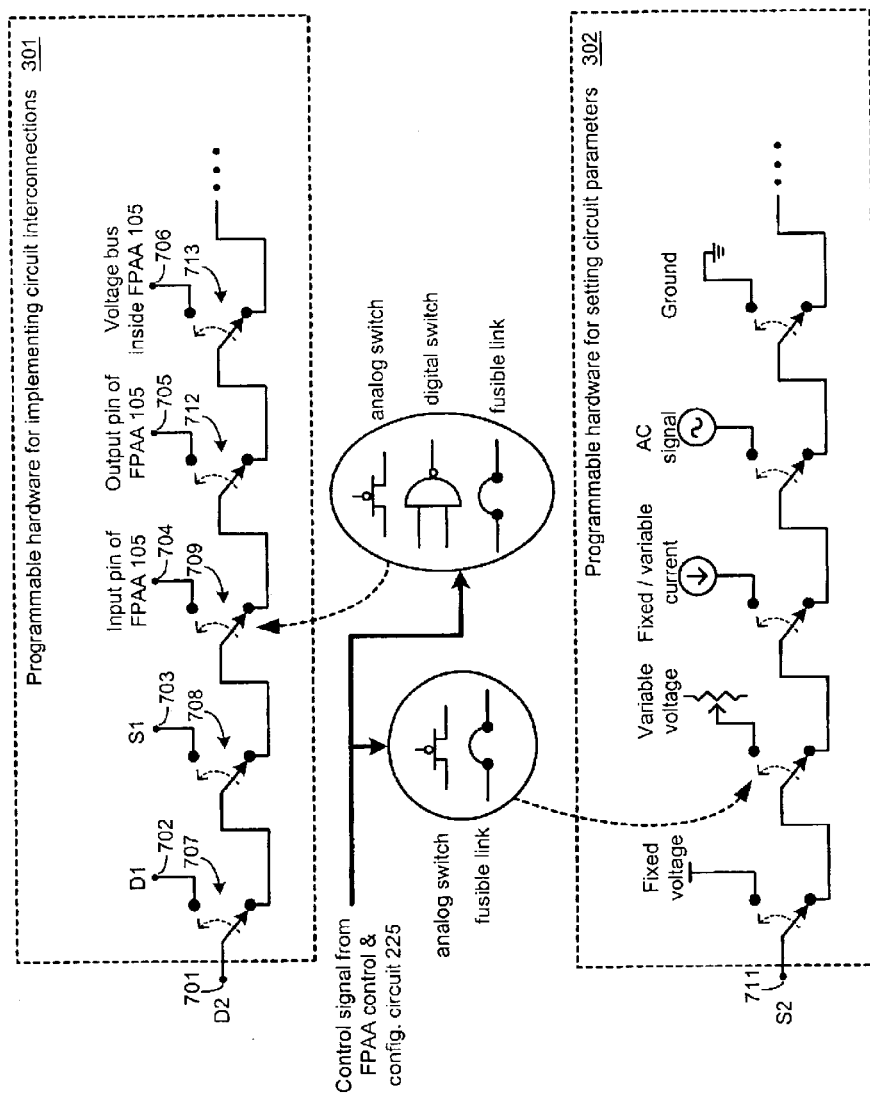
FIGS. 7a and 7b illustrate embodiments of interconnect hardware that are incorporated inside the FPAA of FIG. 1.

FIG. 7a illustrates one embodiment of the programmable hardware incorporated inside interconnect circuit 320 of FIG. 3 and interconnect circuit 425 of FIG. 4. A sequence of operations in programming an FPAA such as FPAA 105, will, in one example operation, involve using the "programmable hardware for implementing circuit interconnections" block 301 to set up interconnections for various elements such as the floating gate arrays of array 630 (shown in FIG. 6), followed by using the "programmable hardware for setting circuit parameters" block 302, to set up circuit parameters such as adjusting the floating gate charge of a floating-gate transistor. This sequence of operations can be reiteratively applied if so desired.

Block 301 shows a cascaded switch circuit that can be programmed to connect terminal 701 to one of several terminals such as terminals 702, 703, 704, 705, and 706 by operating one of the switches in the cascaded switch circuit. A switch of the cascaded switch circuit may comprise an analog switch (for example, a MOSFET switch) or a digital switch (for example, a decoder circuit), the switch being operable under program control of the FPAA control and configuration circuit 225 (shown in FIG. 2) by use of a control voltage to operate the analog switch, a logic level to operate the digital switch. A switch may also comprise a fusible link. The fusible link is operable under program control of the FPAA control and configuration circuit 225 (shown in FIG. 2) by use of a programming voltage applied to a selected fusible link to cause it to melt and provide an open-circuit. A fusible link that is melted (blown) constitutes an "off" connection, while one that is not blown constitutes an "on" connection.

Operation of block 301 can be further explained using an example wherein it is desired that D2 (drain terminal of floating-gate transistor 520 in FIG. 6) that is provided at input terminal 701, be connected to D1 (drain terminal of floating-gate transistor 615 in FIG. 6) that is provided at terminal 702. To perform this operation, FPAA control and configuration circuit 225 (shown in FIG. 2) provides a control signal to switch 707 thereby causing switch 707 to operate and provide a connection path between D2 and D1. It will be understood, that D2 is used here merely as an example, and multiple nodes/terminals of circuitry contained in FPAA 105 can be connected to multiple input terminals that are associated with switching circuits such as the switching circuit shown in FIG. 7a. Such nodes/terminals will typically include voltage/ground buses, transistor terminals, capacitor terminals, as well as input, output, and input/output pin terminals of the FPAA integrated circuit package.

Block 302 shows a cascaded switch circuit that can be programmed to connect S2 (source terminal of floating-gate pFET 520 in FIG. 6) at input terminal 711 to one of several programming sources by operating one of the switches in the cascaded switch circuit. Examples of these programming sources include, but are not limited to, a fixed voltage source, a variable voltage source, a fixed/variable current source, an AC signal source, and a ground connection. A switch may comprise an analog switch (for example a MOSFET device) or a fusible link, that can be operated under program control of the FPAA control and configuration circuit 225 (shown in FIG. 2). This program control may comprise use of a control voltage to operate an analog switch or a programming voltage to configure a fusible link. A fusible link that is blown constitutes an "off" connection, while one that is not blown constitutes an "on" connection.

It will be understood that the cascaded switch arrangement shown in blocks 301 and 302, are for example purposes only. Several other circuits, arranged in a similar cascaded connection or in other non-cascaded switch connections, can be used to provide interconnections to other terminals contained inside FPAA 105. For example, blocks 301 and 302 may contain a second set of cascaded switch circuits that can be used to connect PG2 (program-gate terminal of floating-gate pFET 520 in FIG. 6) to PG1 (program-gate terminal of floating-gate transistor 615 in FIG. 6), or to connect PG2 to a variable voltage source for charging the floating-gate of floating-gate pFET 520.

It will also be understood that many alternative circuits can be utilized to provide the switching functions of blocks 301 and 302. For example, while switches 707, 708, 709, 712, 713 are shown as a serially-connected chain of single-pole-double-throw switches, the cascaded series of multiple switches can be replaced by a single switch having a multi-throw arrangement.

Furthermore, while some applications may permit the programmed switch positions of the switches shown in FIG. 7a to remain undisturbed when power is removed from FPAA 105, in other applications the switch positions may require fresh programming each time after FPAA power-up. The use of fusible links such as described with reference to FIG. 7a, is generally associated with one-time programming procedures, and using these links in FPAA 105 may be used to characterize FPAA 105 as a one-time programmable device.

Figure 7B:
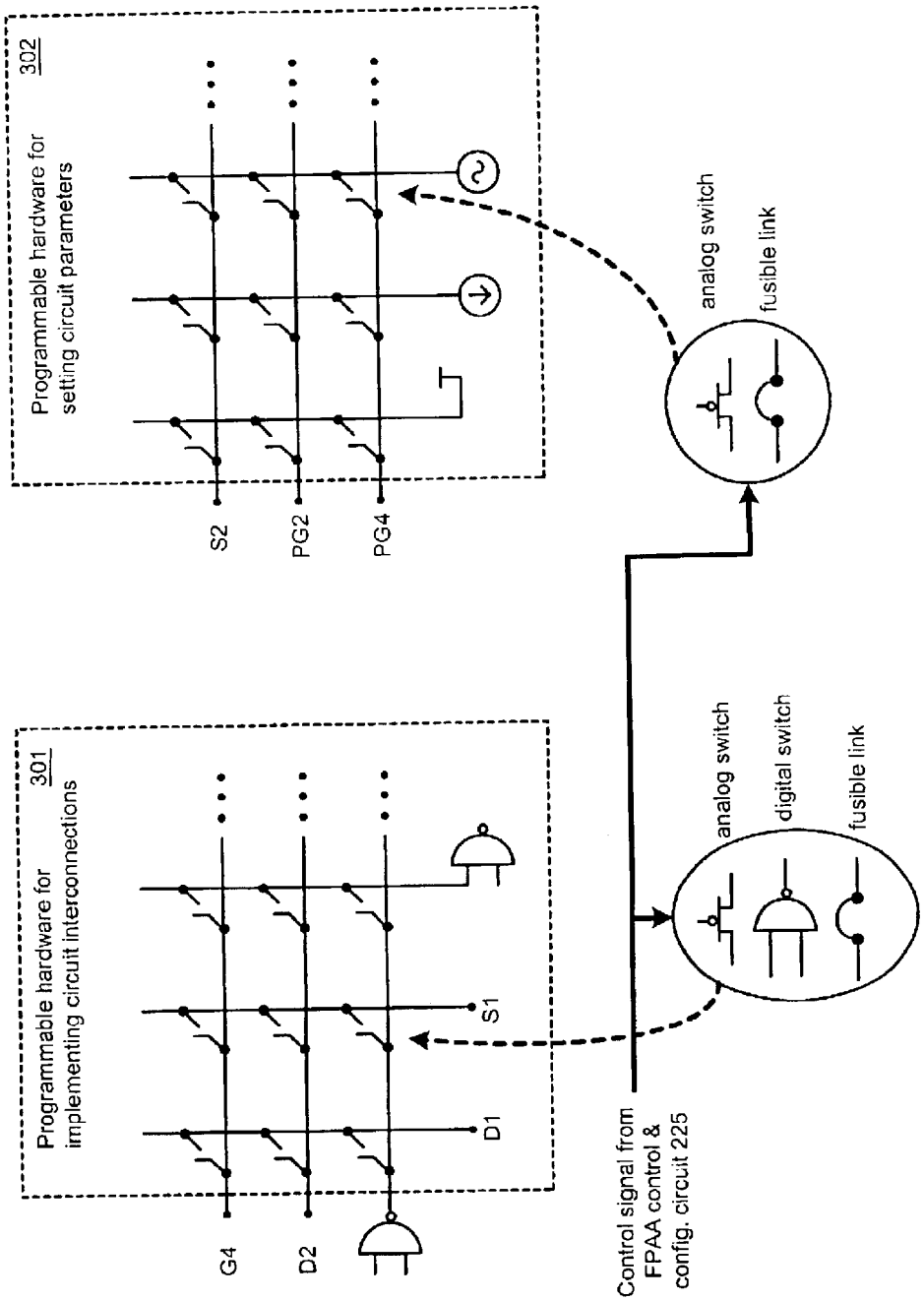

FIG. 7b illustrates a second embodiment of the programmable hardware incorporated inside interconnect circuit 320 of FIG. 3 and interconnect circuit 425 of FIG. 4. Switching matrix blocks 301 and 302 perform functions that are equivalent to those that are performed by blocks 301 and 302 of FIG. 7a. This equivalence will be recognized by persons of ordinary skill in the art.

Figure 8:
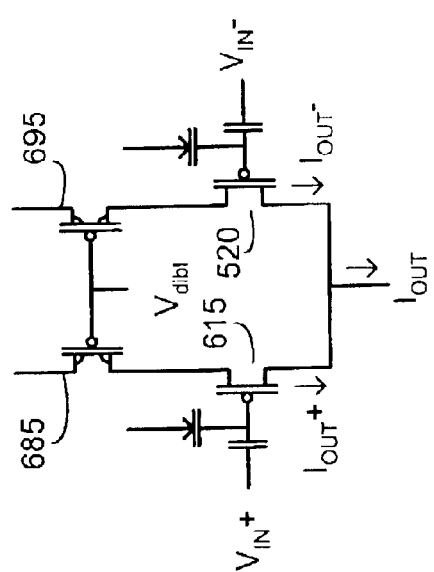
FIG. 8 shows floating-gate pFETs interconnected to form a multiplier circuit that is used in the FPAA of FIG. 1.

FIG. 8 shows floating-gate pFETs 615 and 520 that have been interconnected at their source, gate, or drain terminals, and suitably programmed (using the interconnect circuitry illustrated in FIGS. 7a and 7b) to perform a mathematical computing function, in this particular example—a multiplication function. Other pairs of floating-gate pFETs located in matrix 630 (shown in FIG. 6) may also be suitably programmed such that matrix 630 as a whole, is configured to operate in a computing matrix mode. The explanation of the multiplication function uses material from the following documents, which are incorporated herein by reference in their entirety: "*Mel-frequency cepstrum encoding in analog floating-gate circuitry*" by Paul D. Smith, Matt Kucic, Richard Ellis, Paul Hasler, & David Anderson.

"*Programmable continuous-time floating-gate Fourier processor*" by Matt Kucic, AiChen Low, & Paul Hasler.

Drawing attention to FIG. 8, the source terminals of pFETs 615 and 520 are shown connected to two transistors 685 and 695. These two devices (which may be a part of the application specific circuitry 415 of FIG. 4) are used to as drain-induced-barrier-lowering (DIBL) devices. DIBL devices are used to increase circuit linearity by way of source degeneration in pFETs 615 and 520. If such a degeneration is unnecessary, DIBL devices 685 and 695 may be omitted. The DIBL devices may also be used to provide appropriate feedback signals to permit stable continuous floating-gate currents in pFET floating-gate devices, allowing implementation of useful Hebbian-type learning rules.

A generalized equation to define a floating-gate pFET with a DIBL device connected to its source terminal can be stated as $I_s = I_{so} W \exp(-\Delta V_{in}/V_y)$ where $I_s$ is the subthreshold nFET or pFET channel current in saturation for a change in the FET's gate saturation voltage; $I_{so}$ is a bias current; W is a weight that is a source current measure of the floating-gate charge; and $V_y$ is the exponential slope of this element between capacitive input and channel current.

Referring to FIG. 8, the circuit constitutes a four-quadrant multiplier where a differential input signal ($\Delta V_{in}$) is multiplied by a stored weight value. This stored weight value is the difference of the programmed values of the floating-gate charges that have been set in pFETs 615 and 520. The weight term may be dependent on several factors such as the size of the floating-gate, the charging process, and the amount of charge present at the floating gate.

The circuit of FIG. 8 couples two floating-gate pFETs 520 and 615 in a way that subtracts out their common-mode responses, and the output drain current $I_{out}$ can be defined by the equation $I_{out} = I_{so}(W^+ \exp(-\Delta V_{in}/V_y) + W^- \exp(-\Delta V_{in}/V_y))$, assuming that the input voltages are within the linear range $V_y$. This equation can be simplified by approximating the exponential terms as linear functions, by $I_{out} \approx I_{so}(W^+ + W^-) + I_{so}(W^+ - W^-) \Delta V_{in}/V_y$, where $W^+$ and $W^-$ are the weights corresponding to pFETs 520 and 615 that are provided with $V_{in}$ + and $V_{in}$ - voltages. The output current reflects the four-quadrant product of the input voltages multiplied by the weights.

It is relevant to point out that the multiplier circuit of FIG. 8 performs a "multiplication" function between a signal and a weight, unlike a "mixing" function between two signals that is typically carried out in a mixer circuit. The multiplication function can be broadly defined as multiplying an input signal with a stored value/weight. This stored value can be considered a gain term. So if the gain term is zero, and the incoming signal is multiplied by this zero value, the output signal from the multiplier circuit will be of negligible amplitude.

Figure 9:
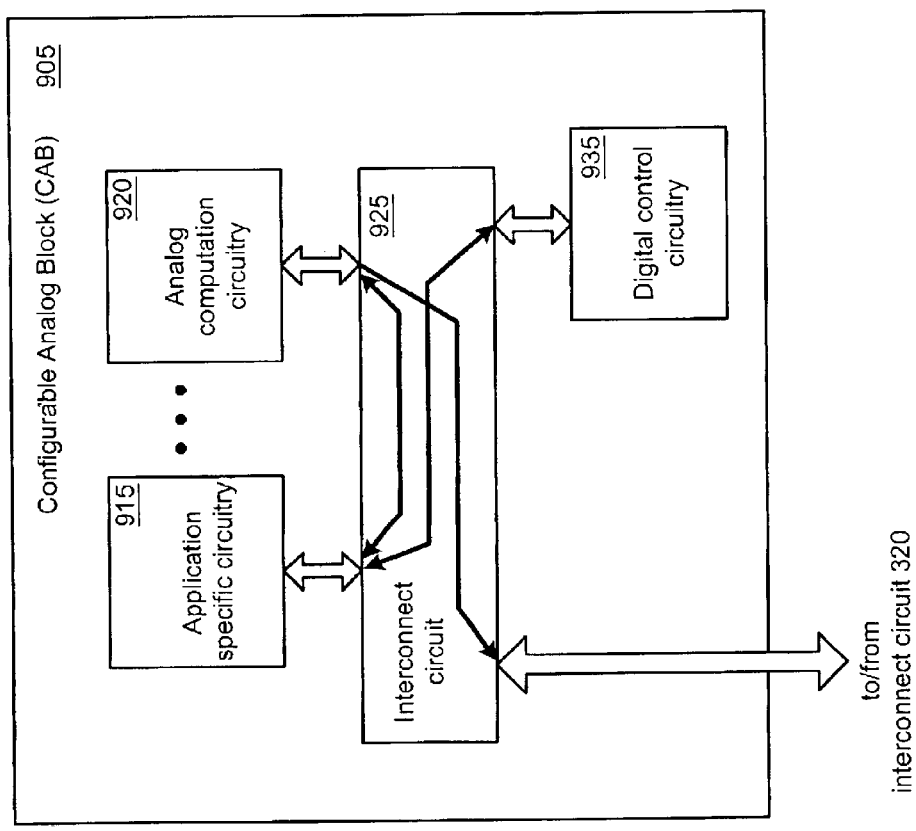
FIGS. 9, 10, and 11 are a set of illustrations provided in a hierarchical manner, to explain an exemplary transform imager application that has been implemented using the circuits contained in FPAA of FIG. 1.
Figure 10:
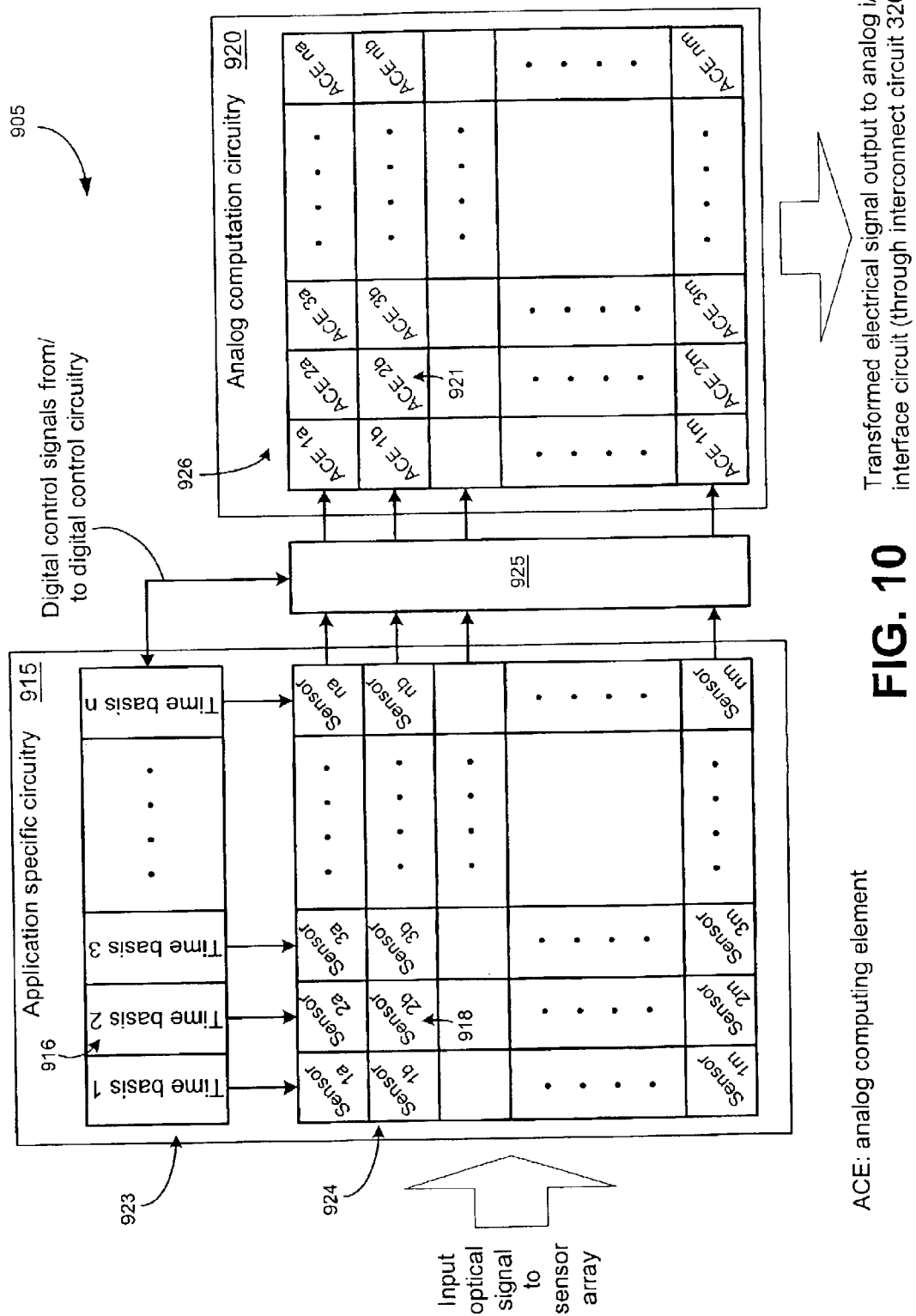
Figure 11:
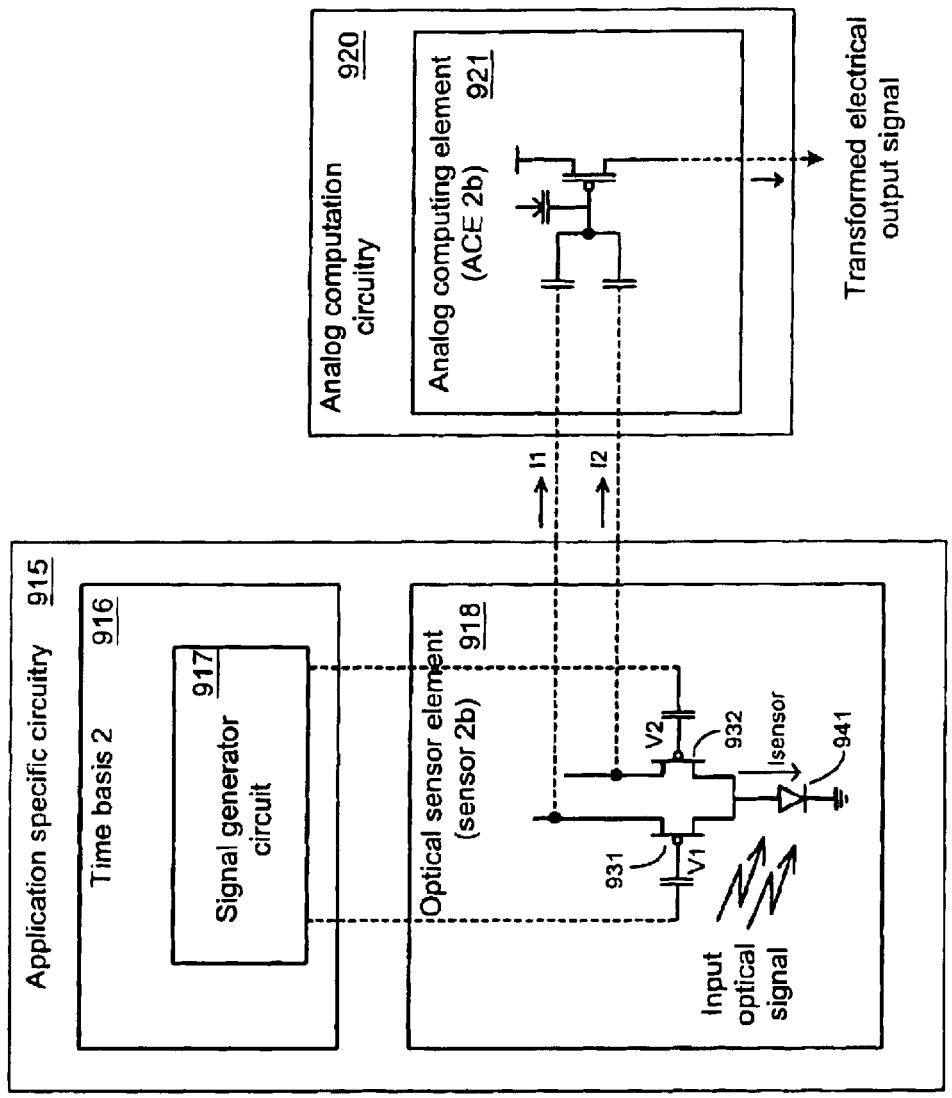

FIGS. 9, 10, and 11 are a set of illustrations provided in a hierarchical manner, to explain an exemplary transform imager application that has been implemented using the circuits contained in FPAA 105. This explanation uses material from the following document: "*A Matrix transform Imager allowing high-fill factor*" by Paul Hasler, Abhishek Banclyopadhyay, and Paul Smith, and this document is incorporated herein by reference in its entirety.

FIG. 9 shows some of the functional blocks that are shown in FIG. 4, configured in one sample embodiment as the transform imager; while FIGS. 10 and 11 show the circuitry of FIG. 9 in more detail. FIG. 9 shows CAB 905 containing the main functional blocks used in the transform imager application, and the relevant interconnections that are programmed into the interconnect circuit 925. FIG. 10 shows the CAB 905 of FIG. 9 in more detail.

Drawing attention to FIG. 10, application specific circuitry 915 contains an array of time basis elements 923 (time basis 1 . . . n), and an array of optical sensor elements 924. Each of the time basis elements operates as a function generator providing a signal that is available throughout a corresponding column of the array of optical sensor elements 924. For example, time basis 2 provides a signal that is available to sensor elements 2a, 2b, . . . 2m of its column. Time basis elements may comprise several circuits, some examples including an oscillator, a pattern generator, or an analog memory element. These elements may be optionally configured and controlled via digital signals that are provided by digital control circuitry 935 (shown in FIG. 9) through interconnect circuit 925.

The array of optical sensor elements 924 is formed of individual optical sensors, each of which uses a minimum of additional components in its immediate vicinity, thereby allowing creation of an optical sensor matrix array that provides optimal optical fill-space. Fill-space is typically described by a fill-factor, which is defined as a ratio of the available optical image sensor area to the overall area used by the optical processing circuitry. Each optical sensor can be used as a pixel processing element that outputs a current proportional to the multiplication of the time basis signal and a photosensor current.

Analog computation circuitry 920 contains an array of analog computing elements 926 where the size of the array matches that of the array of optical sensor elements 924, with each analog computing element (ACE) corresponding to a unique optical sensor element in the array of optical sensor elements 924. An ACE is formed of one or more floating-gate transistors that accept a current from an optical sensor element and transform this current through various processes such as multiplication, switching, and level-shifting to provide image transformation at a pixel level.

FIG. 11 shows details of one set of exemplary elements that are a part of the arrays located inside the application specific circuitry 915 and the analog computation circuitry 920. Signal generator circuit 917 may be programmable to generate several signals. For example, it may generate a low-frequency sine wave that is fed into the corresponding column in the array of optical sensor elements 924. Optical sensor element 918 that is part of this column, and is used as an example element, accepts this signal at its gate terminals. The two transistors 931 and 932, which may be floating-gate pFETs or other types of transistors, are interconnected to an optical sensor diode 941, using the interconnect circuitry contained inside FPAA 105 as was explained earlier. In this example circuit, the two transistors 931 and 932 are connected as a differential-pair.

The input optical signal that is directed towards the optical sensor diode 941, causes an optical sensor diode current to be generated that is shared between the two transistors. The current sharing is dependent upon the gate voltages V1 and V2, present at the individual gates of the two transistors at any given moment in time, coupled with any floating-gate charges that may be individually programmed at these two gates, if the two gates are floating-gate transistors.

For the differential-pair configuration of transistors 931 and 932 operated with sub-threshold bias currents (typically used in imaging applications due to the presence of low-level image sensor currents), the differential output current can be expressed as:

$$I_1 - I_2 = I_{sensor} \tanh\left(\frac{k(V_1 - V_2)}{U_T}\right)$$

where k is the gate coupling efficiency into the transistor surface potential (typically 0.6 to 0.8v), and $U_T$ is k T/q. If $V_1 - V_2$ inputs are such that the transistors operate in their linear range, $$I_1 - I_2 = I_{sensor}\left(\frac{k(V_1 - V_2)}{U_T}\right),$$

which is the product of the sensor output current and the differential voltage input.

The differential output currents are summed and further processed in analog computing element 921 (located inside the analog computation circuitry 920 of FIG. 10), which is a floating-gate transistor. The floating-gate transistor may be configured as an analog memory element, or as a non-linear computing circuit to carry out mathematical transformation operations.

It can be understood that the transform imager application described using FIGS. 9, 10, and 11 provides pixel-level image processing in a modularly-expandable matrix configuration, with various computing parameters that are programmable using floating-gate transistors inside the FPAA 105. This configuration allows formation of dense optical sensor arrays because additional circuitry, such as the analog computing element 921 can be located away from the optical sensor area. Some example applications for this kind of processing include image filtering, computing spatial derivatives, and 2D spatial transforms.

Matrix transforms can be generally described by the formula $Y = A^T P B$, where P denotes a row and column array of pixels, A is a transform matrix corresponding to the transform carried out upon an image plane by a basis function, and B is a transform matrix that is subsequently carried out. As an example implementation using the circuit shown in FIG. 10, the values of A may be applied via the time basis circuits 923, while the values of B may be stored in the analog computation circuitry 920.

Figure 12:
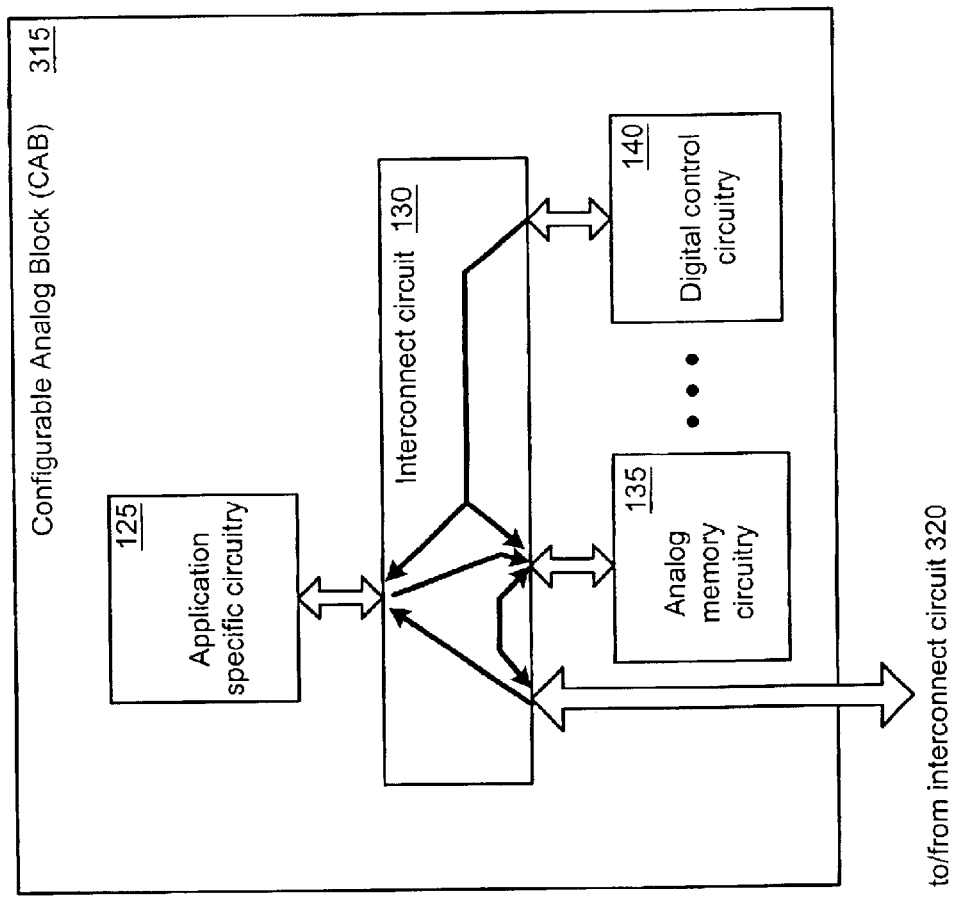
FIGS. 12, 13, and 14 are a set of illustrations provided in a hierarchical manner, to explain an exemplary cepstrum processor using floating-gate transistors for a speech processing application, that has been implemented using the circuits contained in FPAA of FIG. 1.
Figure 13:
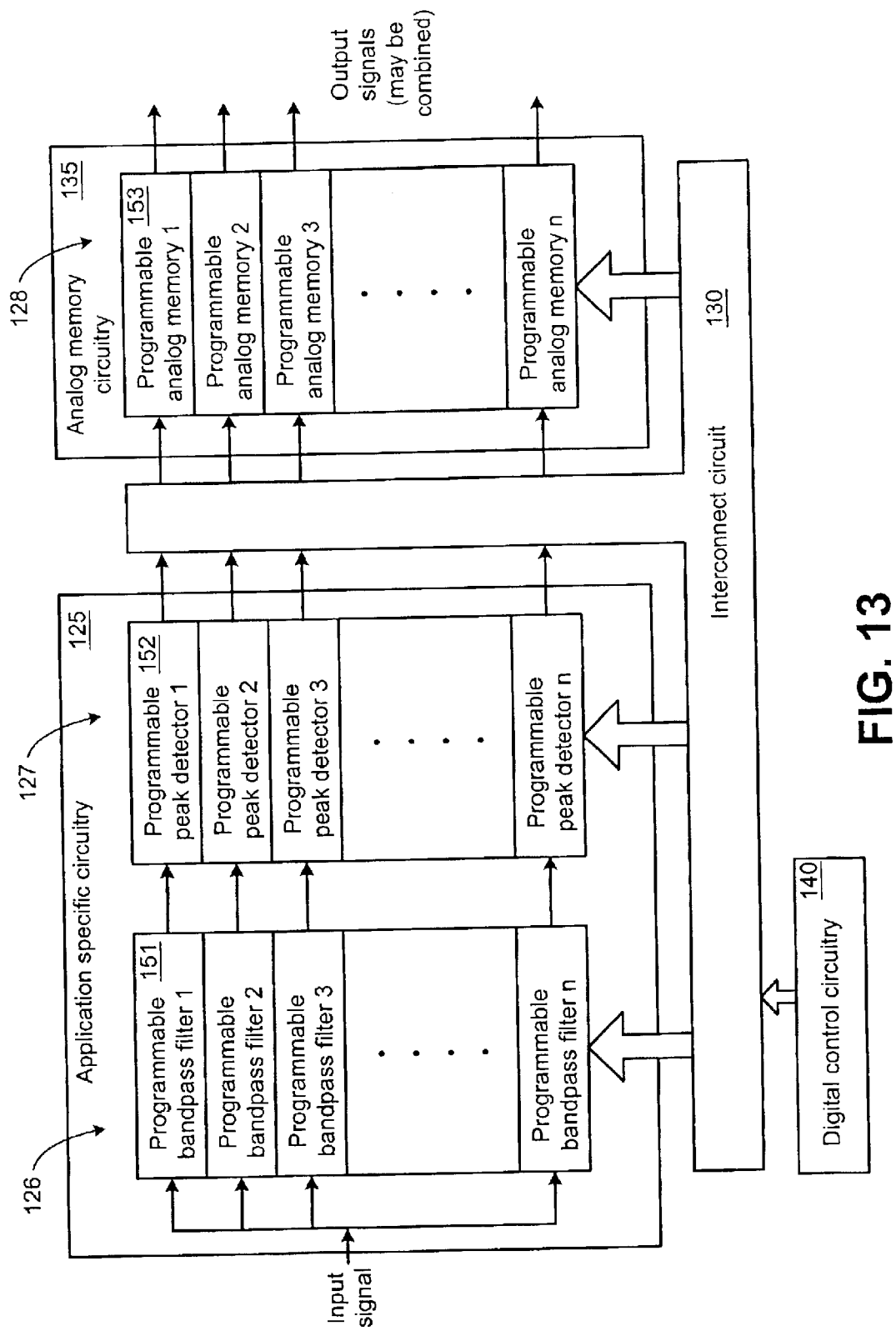
Figure 14:
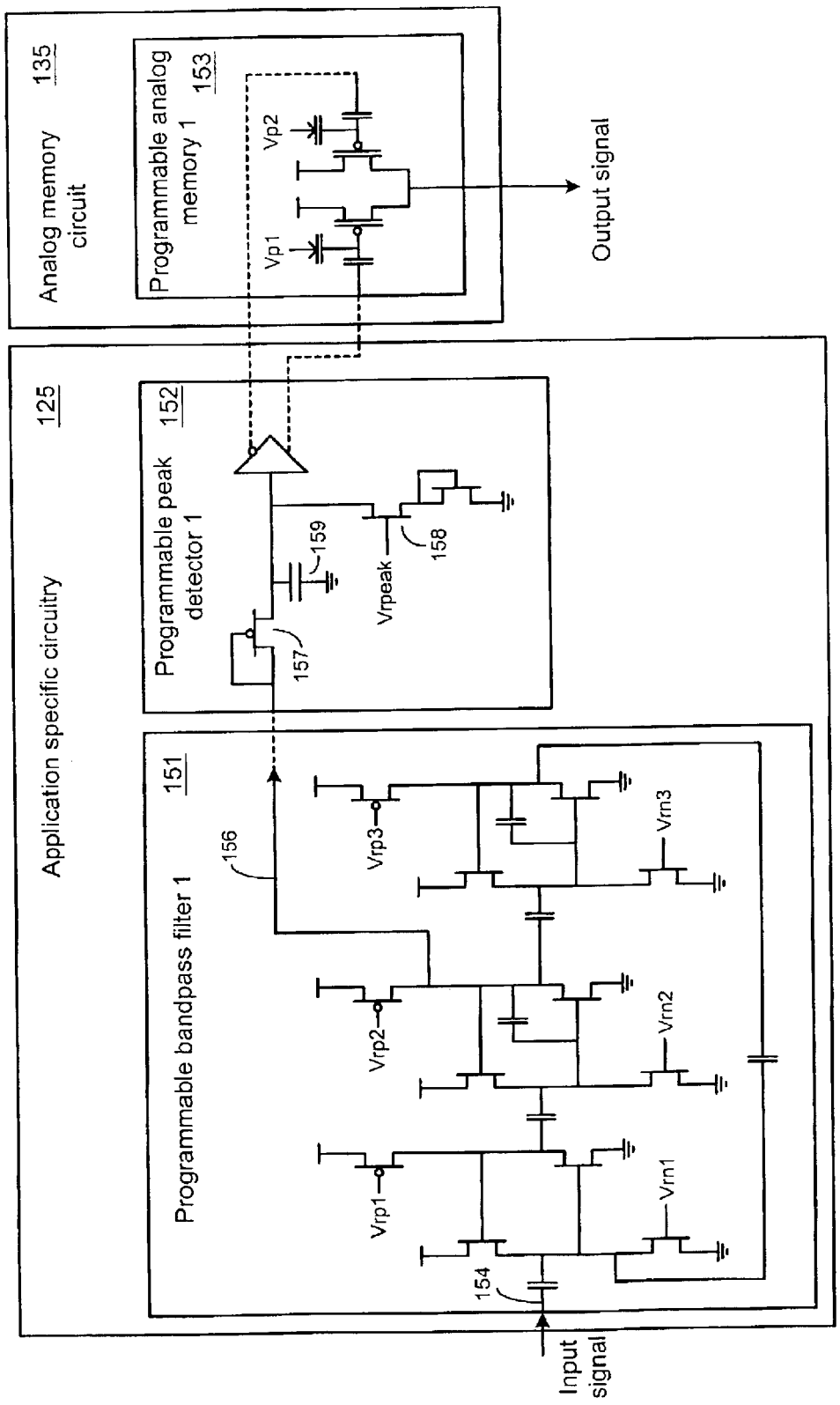

FIGS. 12, 13, and 14 are a set of illustrations provided in a hierarchical manner of an exemplary cepstrum processor using floating-gate transistors for a speech processing application. The processor, which will be describe below, has been implemented using circuits contained in FPAA 105. The description uses material from the following document, which is incorporated herein by reference in its entirety: "*Mel-frequency cepstrum encoding in analog floating-gate circuitry*" by Paul D. Smith, Matt Kucic, Richard Ellis, Paul Hasler, & David Anderson.

FIG. 12 shows some of the functional blocks that are shown in FIG. 4, configured in one sample embodiment as a cepstrum processor; while FIGS. 13 and 14 show the circuitry of FIG. 12 in more detail. Drawing attention to FIG. 13, application specific circuitry 125 contains an array of programmable bandpass filters 126 (programmable bandpass filters 1 . . . n), and an array of programmable peak detectors 127 (programmable peak detectors 1 . . . n). Each of the programmable bandpass filters receives an input signal that is provided in common to all filters, and provides an output signal to a correspondingly-connected programmable peak detector. For example, programmable bandpass filter 151 provides a signal into programmable peak detector 152. The high-end and low-end corner frequencies of each programmable bandpass filter can be suitably set, independent of the settings in other programmable bandpass filters. This feature allows the array of programmable bandpass filters to be programmed to operate with a frequency spacing that is user-selectable to be linear, non-linear, octave-oriented, or logarithmic.

Each of the programmable peak detectors, which can be programmed using a control voltage to provide a user-selectable frequency response, provides a signal to a correspondingly-connected programmable analog memory contained in programmable analog memory array 128 of analog memory circuitry 135. For example, programmable peak detector 152 provides a signal into programmable analog memory 153.

Interconnect circuitry 130, which is one embodiment of the interconnect circuitry 425 of FIG. 4, is used for example, to set up interconnections in the analog memory circuit 135; and to program parameters such as weights in the floating gate transistors contained inside analog memory circuit 135 as well as application specific circuitry 125. The interconnections and programming is carried out using signals generated by digital control circuitry 140 as well as signals that may be incorporated inside the interconnect circuitry 130.

The concept of cepstral analysis involves decomposing an input signal into certain component parameters. However, speech signals are non-stationary in the time-domain. Thereby, the time-frequency spectrum of speech signals is not constant. Traditional approaches to cepstral analysis involves the use of short-term Fourier analysis using discrete Fourier transform (DFT) and inverse DFT. Mel-cepstrum analysis, which is a variant of cepstrum analysis, is implemented traditionally in the discrete domain, by splitting a signal into critical band energies and then performing the discrete cosine transform (DCT) on the sequence of critical band energies. The band splitting circuitry typically includes analog-to-digital conversion circuitry.

FIGS. 12, 13, and 14 illustrate an analog approach using floating-gate transistor arrays as mel-cepstrum computational blocks. By using a purely analog approach, digitization noise that may be introduced during analog-to-digital conversion is eliminated. Analog processing also allows processing of higher-order properties of signals. One example of such a higher-order property would be the high-frequency information that is present in speech signals during fricatives and/or diphthongs. The spectral content of these transitive sounds appear as a spike in the time-domain. A signal spike in the time-domain equates to a broad-spectrum signal in the frequency-domain. Capturing such spikes, which provide valuable speech information, is relatively easier to implement in the time-domain.

It will be recognized, that FIGS. 12, 13, and 14 are being used merely to illustrate one exemplary application. This approach and its variants may be used in several other applications, such as speech recognition circuits incorporating analog cepstrum, analog hidden Markov models (HMM), and vector quantization (VQ) circuits.

FIG. 14 shows an exemplary circuit containing programmable bandpass filter 151, which is contained in the array of programmable bandpass filters 126, connected to programmable peak detector 152, which is contained in the array of programmable peak detectors 127. Also shown is programmable analog memory 152 that is contained in the programmable analog memory array 128. The programmable bandpass filter 151 used here is a capacitively coupled current conveyor ($C^4$) incorporating one or more differential stages. For the sake of brevity, only one half of the differential circuit is shown in programmable bandpass filter 151. It will be understood that in the differential circuit, positive input terminal 154 will have a corresponding negative input terminal that is not shown in FIG. 14. Also, positive output signal line 156 will have a corresponding negative output signal line that is not shown. The high-end and low-end corner frequencies can be programmed by adjusting the bias currents in the various transistors of the circuit. Suitable application of bias voltages upon voltage terminals labeled Vrp1, Vrp2, Vrp3, Vrn1, Vrn2, and Vrn3 are used to adjust the bias currents, such bias voltages being provided through the interconnect circuit 130.

Programmable peak detector 152 comprises a rectifier element, for example FET 157 that is configured as a diode, together with a capacitor 159. FET 158, which is connected in parallel with capacitor 159, constitutes a variable resistor whose resistance can be programmed via a voltage Vrpeak. The value of the R-C combination of capacitor 159 and FET 158 can be programmed to set the high-end corner frequency for cutoff of the signal in the programmable peak detector 152.

Programmable analog memory 152 uses two floating-gate transistors shown in this example circuit connected to provide a multiplier function as was explained with reference to FIG. 8. This allows the output signal of programmable peak detector 152 to be multiplied by a suitable weight that is programmed into the floating-gate transistors by using the interconnect circuit 130.

FIGS. 15a, 15b, 15c, 15d, 15e, and 15c illustrate circuitry that uses floating-gate pFETs incorporated into the analog computation circuitry 420 (shown in FIG. 4) to provide an analog multiplication function together with adaptive gain. Such a function is useful in many applications, for example, low-power analog adaptive filtering and neural networks.

The description uses material from the following document, which is incorporated herein by reference in its entirety: *"Improved correlation learning rule in continuously adapting floating-gate arrays using logarithmic pre-distortion of input and learning signals"* by Jeff Dugger and Paul Hasler.

Figure 15A:
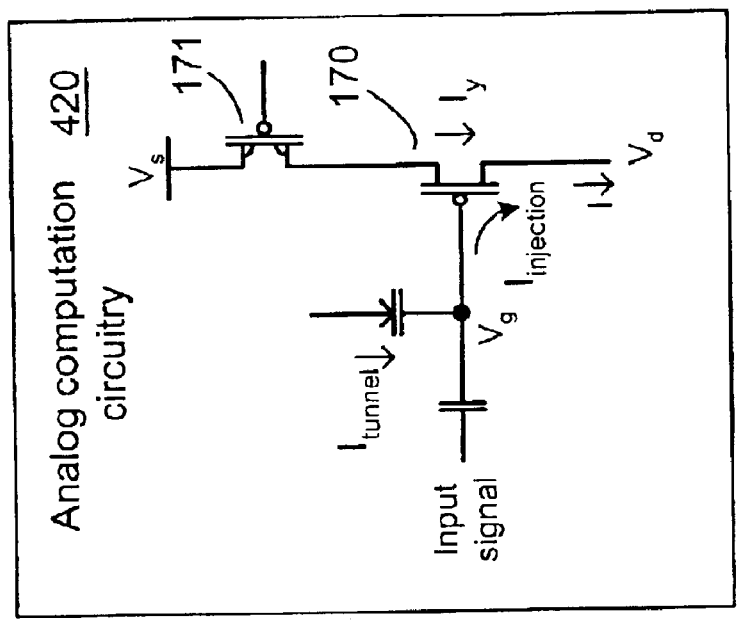
FIGS. 15a, 15b, 15c, 15d, 15e, and 15f illustrate circuitry that uses floating-gate pFETs incorporated into the circuits contained in the CAB circuit to provide an analog multiplication function coupled with adaptive gain.

FIG. 15a shows a source-degenerated pFET 170, which when operated in a sub-threshold mode, produces a current that is a product of an exponential function of its gate voltage and a weight factor.

This current is defined by the equation:

$$I = I_b w e^{-\Delta V_K / V_{KA}}$$ (Equation 1)

where $I_b$ is the bias current, w is the weight function, and $V_{gA}$ is a voltage scaling factor.

If the amplitude of the gate voltage is made small enough, the equation above can be interpreted as a linear approximation, whereby pFET 170 can be operated as a transconductance amplifier with adaptive gain being provided by the weight function. The weight function may be tailored using a charge stored in the gate of pFET 170 by using a weight-update circuit. This weight-update circuit may incorporate a learning rule that is based on correlations between the gate and drain voltages of pFET 170. One such learning rule is defined by the equation:

$$\tau \frac{dw}{dt} = w^\gamma e^{\Delta V_g / V_{g0}} e^{-\Delta V_d / V_{inj}} - w^\beta e^{-\Delta g / V_{g1}}$$ (Equation 2)

where $\beta$, $\gamma$, $V_{g0}$, $V_{g1}$, and $V_{inj}$ are constants which depend on device parameters, bias conditions, and circuit configurations.

While it is desirable to obtain a learning rule that is purely dependent on correlations between the gate and drain voltages; it can be seen that the weight function in the learning rule equation above is influenced by exponential functions of the gate and drain voltages that are additionally dependent on the gate voltage variance as well as drain voltage variance.

It is also desirable to make the gate voltage of pFET 170 small enough to obtain a linear model while simultaneously keeping it large enough to encounter correlation behavior. Determining a suitable gate voltage setting that can satisfy these conflicting requirements may result in harmonic distortion that adversely affects the weight function.

Such harmonic distortions may be minimized by using a pre-distortion circuit connected to the gate of pFET 170, while the effect of the drain voltage variance term on the weight function may be minimized by incorporating a drain non-linearity transform circuit connected to the drain of pFET 170. Sample pre-distortion circuits will be explained further using other figures.

Drawing attention to the circuit of FIG. 15a, pFET 170 is configured to operate with a floating-gate charge that is at an equilibrium condition. This equilibrium condition is reached while carrying out tunneling to add charge and hot-electron injection to remove charge from the floating-gate. The addition and removal of charge can occur concurrently, fairly-concurrent, or in a sequential manner, such actions being depending upon the circuit configuration into which pFET 170 is placed. Various parameters contribute to the total charge at the gate. This will be explained with reference to FIG. 15b.

The process of carrying out both addition and removal of gate charges in such a concurrent manner, leads to an unstable condition for pFET 170 wherein the gate charge affects the source-drain current to generate positive feedback. This will occur if pFET 170 is operated independent of any other devices such as pFET 171. Therefore, pFET 171 is connected to pFET 170 to provide circuit stabilization. In certain circuit configurations, pFET 171 may comprise a MOSFET that is used to provide a source-follower circuit, while in some other applications a floating-gate MOSFET such as pFET 171 of FIG. 15a may be used to provide a degenerated floating gate circuit.

The injection current, $I_{inj}$, during charge equilibrium has a non-linear dependence upon the voltages present at the source, drain and gate terminals of pFET 170. This non-linear dependence allows use of the circuit as a multiplier, which is one of several computational functions that can be exploited in computational applications. Such computational applications include for example, weight adaptation where the weight is a function of the gate charges that can be suitably manipulated, and analog memory where the variable charge equates to a variable stored analog value.

Figure 15B:
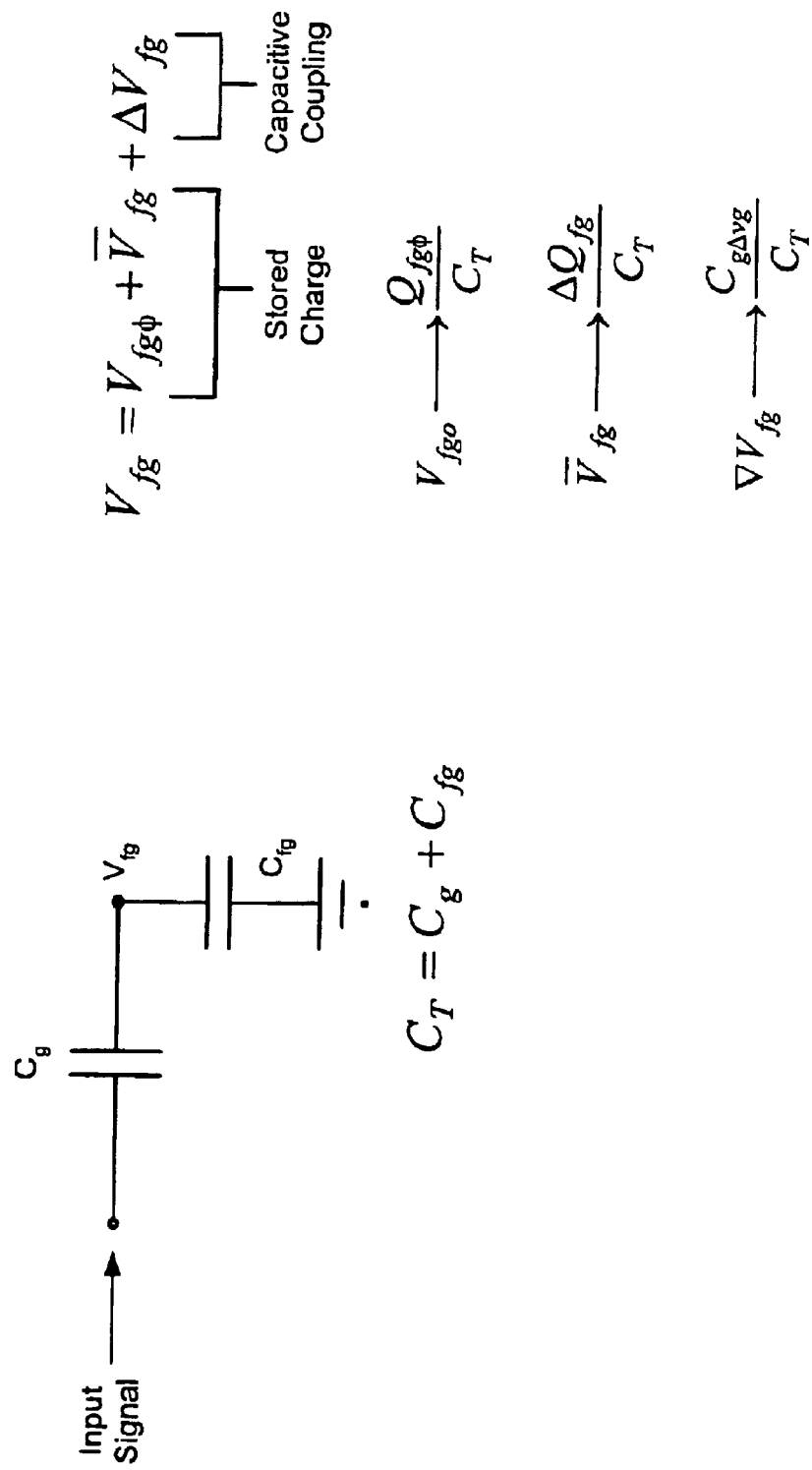

FIG. 15b illustrates characteristics of the floating-gate charge in pFET 170 of FIG. 15a. The total charge $Q_{fg}$ equals a charge that is provided to the gate through capacitor $C_g$ and a floating-gate charge that is set via tunneling and hot-electron injection. This is further elaborated by the floating-gate voltage equation where $V_{fg}$ comprises two terms that are associated with the stored charge at the gate, and a third term that is associated with the charge that is provided by an input signal via $C_g$.

Figure 15C:
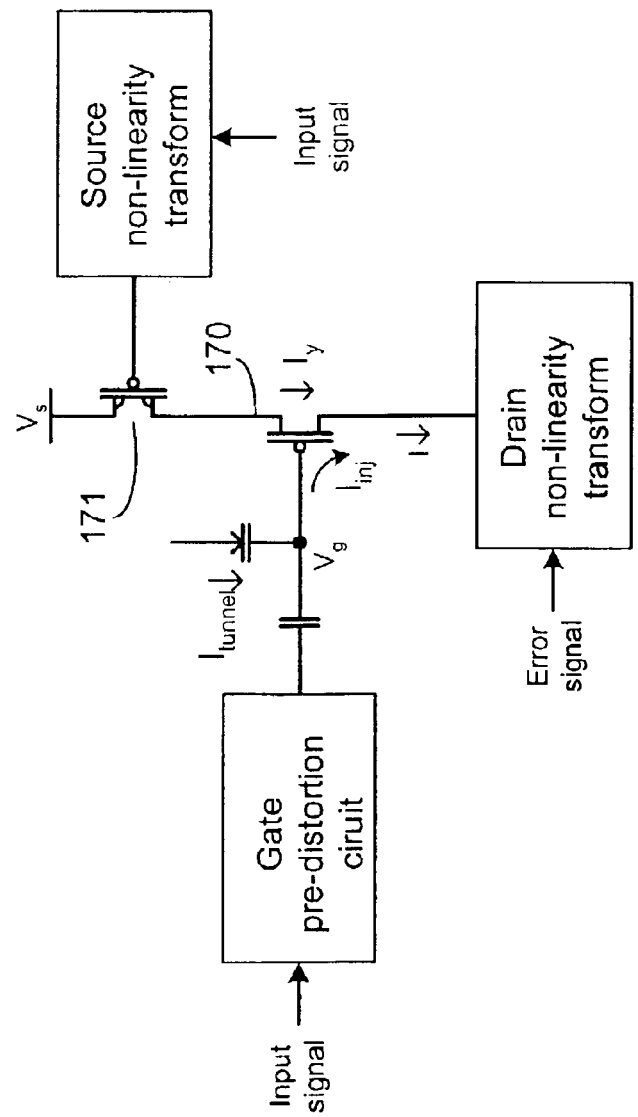

Referring back the description of FIG. 15a where pre-distortion circuits were mentioned, FIG. 15c illustrates pFET 170 with a gate pre-distortion circuit 191, a drain non-linearity transform circuit 192, and a source non-linearity transform circuit 193. These circuits are explained further with reference to FIGS. 15d and 15e.

Figure 15E:
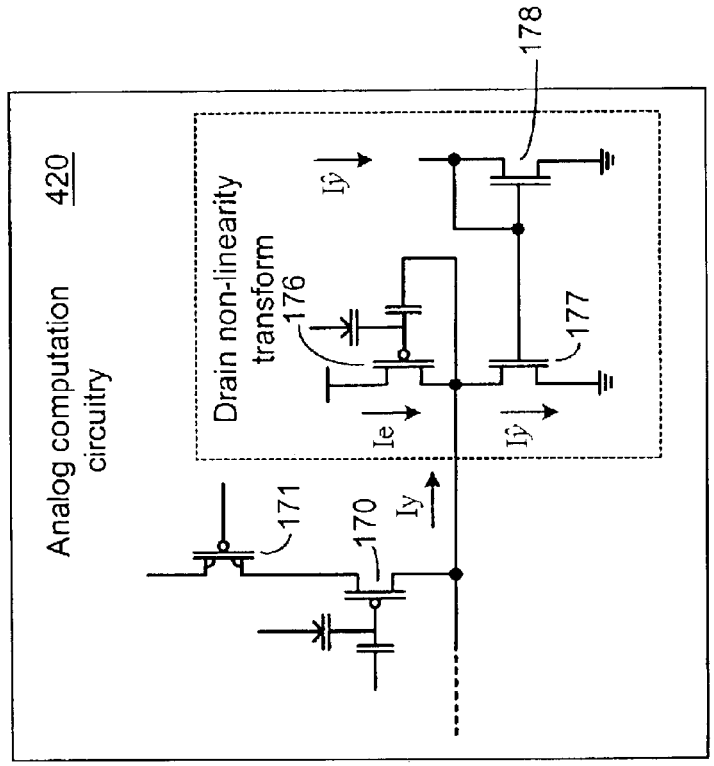
Figure 15D:
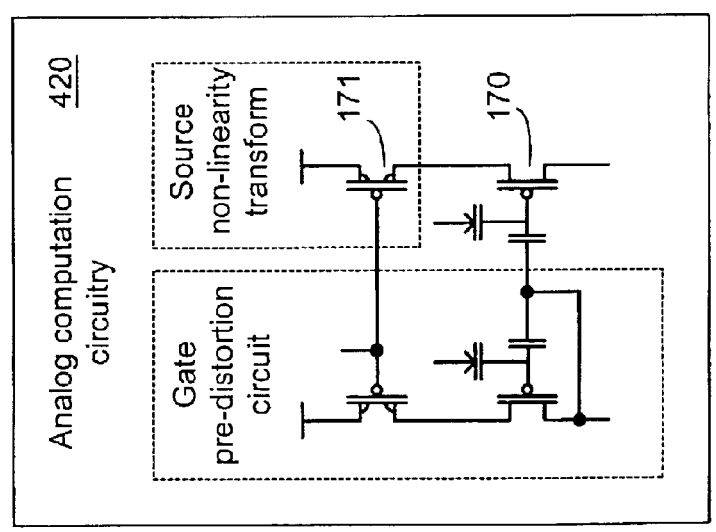

FIG. 15d illustrates one exemplary embodiment of a gate pre-distortion circuit connected to the gate of pFET 170. The pre-distortion circuit comprises a current mirror function that provides a voltage input into the gate of pFET 170. This gate voltage is defined by the following equation:

$$\Delta V_g = V_{mg} \ln(1+x) \quad \text{(Equation 3)}$$

where $V_{mg}$ is chosen in correspondence with $V_{gA}$ to cancel the exponential dependence of the output current I on the input signal, as described in equation 1.

FIG. 15e illustrates one exemplary embodiment of a drain non-linearity transform circuit connected to the drain of pFET 170 to minimize drain voltage variance terms that affect the weight value. The drain pre-distortion circuit includes transistors 176, 177, and 178. The equation for the drain voltage Vd can be defined as:

$$V_d = -V_{md} \ln(I_e/I_{e0}) \quad \text{(Equation 4)}$$

$$V_{md} = \frac{c_T}{c_{warp}} \frac{u_T}{k}.$$

It is desirable to set $I_e = I_{e0}(1+e)$, where e is an error signal used to drive learning and equation 6 can be correspondingly interpreted as:

$$V_d = -V_{md} \ln(1+e) \quad \text{(Equation 5)}$$

A chart of dc current value versus drain voltage amplitude corresponding to various distortion factors is then used to determine a pre-distortion factor that can then be incorporated into the circuit of FIG. 15c.

Figure 15F:
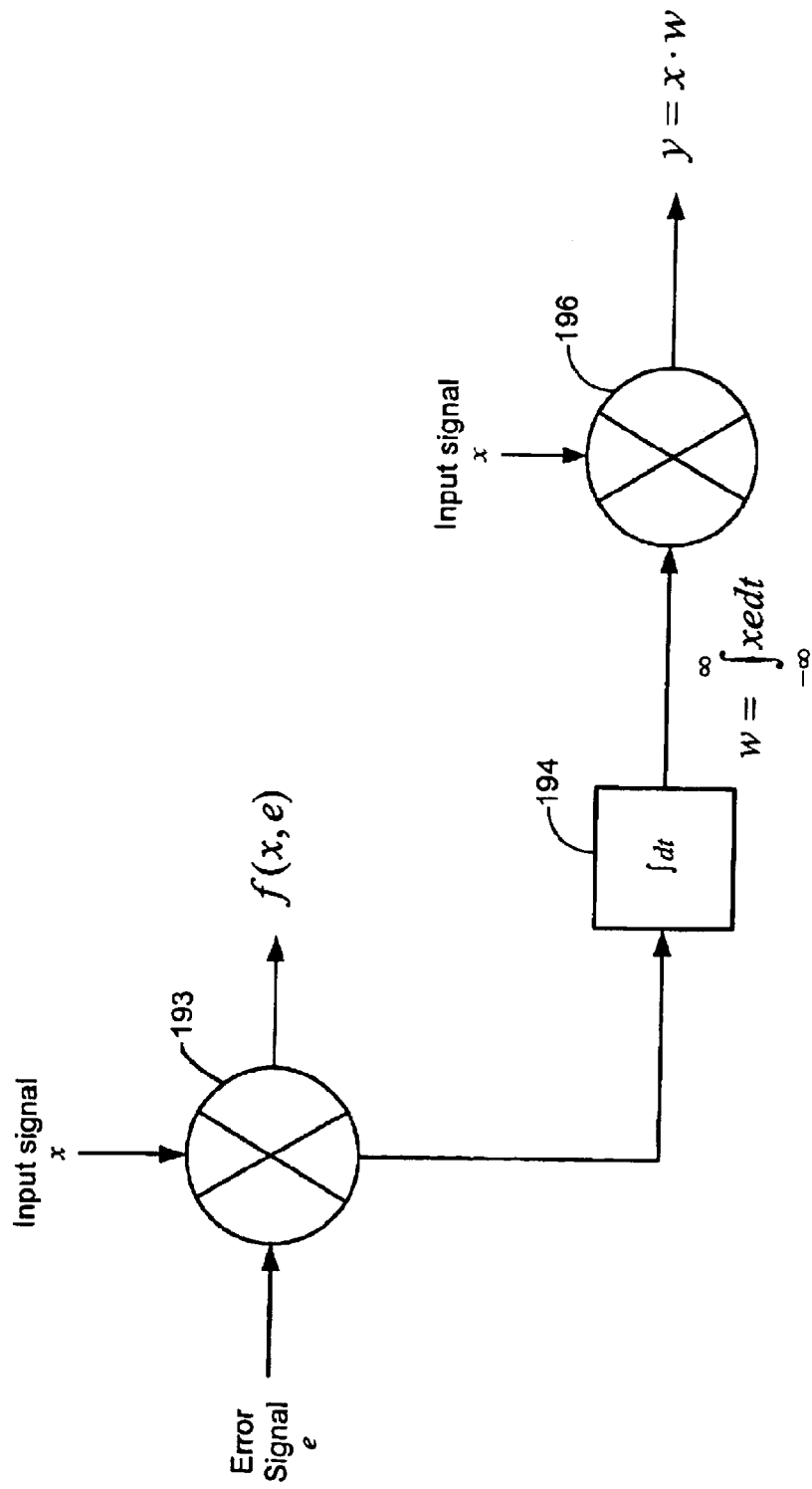

FIG. 15f shows a block diagram representation of a computation circuit using the circuitry explained with reference to FIGS. 15a, 15b, 15c, 15d, and 15e, that may be used in several applications. A weight adaptation circuit comprised of non-linear multiplier 193 may be used to produce a non-linear multiplication function. The multiplier function is inherent to the operation of pFET 170 in FIG. 15c, which is one example circuit.

Multiplier 193 produces a non-linear output signal that contains product terms related to a first input signal and a second input signal. If for example, the first signal is an input signal x, and the second input signal is an error signal e, the non-linear output signal may be stated by an exemplary equation, $f(x) = a\ x^2 + b\ xe + c\ e^2$. As can be seen this equation has a first order term (b xe), as well as second order (a $x^2$, c $e^2$) product terms. It will be understood that several other such equations, wherein additional higher-order terms that are raised to powers of "n" (other than 1 and 2 as in the example equation), for example $x^3$, may be used to provide non-linear functionality.

It can be understood that multiplier 193 can thus be used to obtain various polynomial functions of an input signal and an error signal over time, due to the non-linear functionality of the injection current in the floating-gate pFET 170.

If it is desired that this non-linear relation between the input and error signals be reduced solely to the term bxe, the other polynomial terms have to be eliminated. This elimination may be performed by incorporating the drain non-linearity transform circuit 192 and the source linearity transform circuit 193 explained earlier, resulting in a pure multiplication between the input and error signals.

Integrator 194 performs an averaging operation on the results of multiplier 193, producing various statistical functions of the input and error signals provided to multiplier 193. Multiplier 196 produces an output signal that is a product of the input signal fed into it, and a second signal that is derived from integrator 194 of the weight adaptation circuit. This multiplication function may also be termed as a tap-weight for use in an adaptive filter function or as a synapse for use in a neural network structure because it provides the necessary multiplication of an incoming signal by a signal-dependent adaptive parameter, which is the key feature common to both adaptive and neural signal processing systems.

Figure 16:
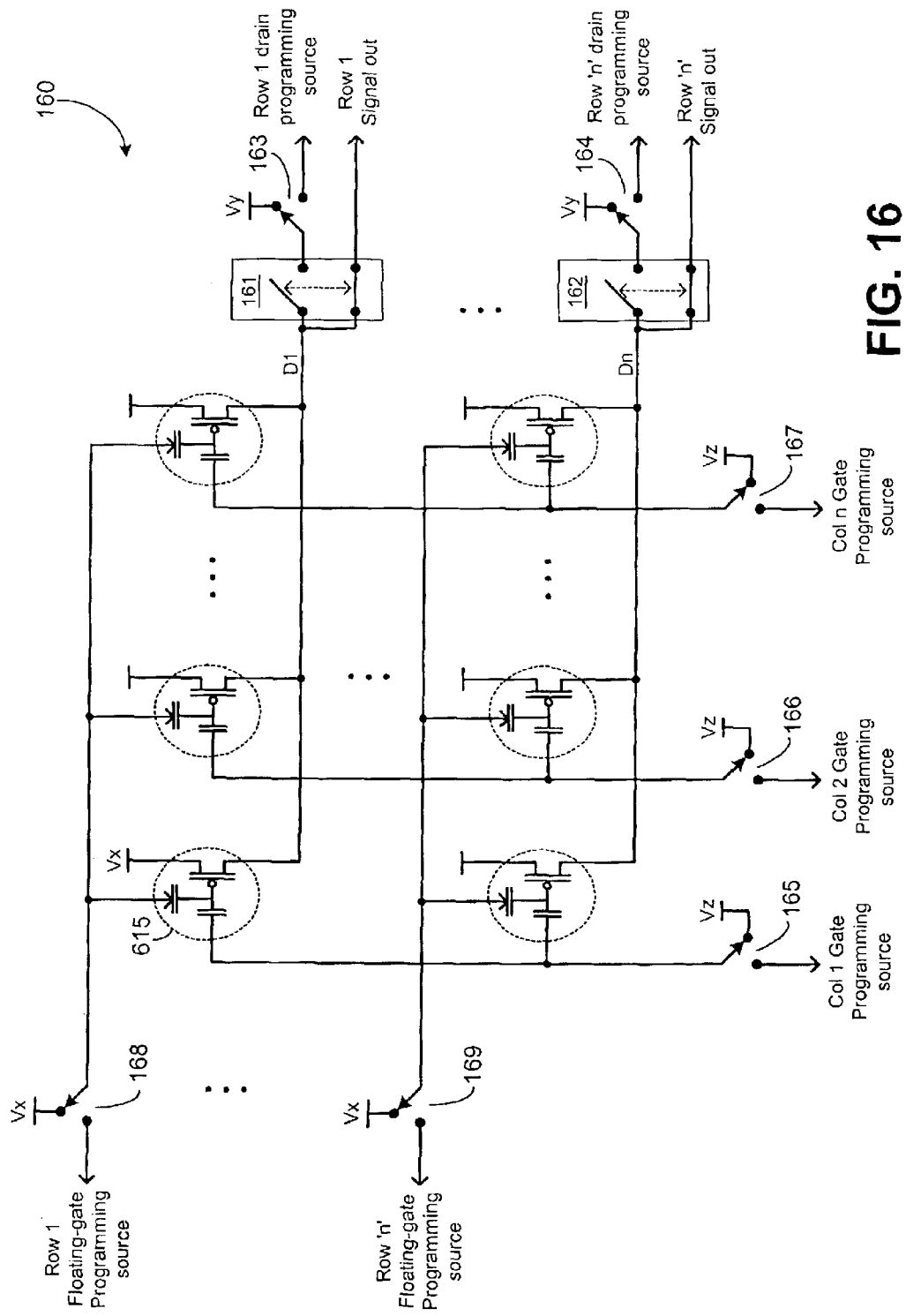
FIG. 16 shows a matrix circuit formed of several floating-gate pFETs, which is used to illustrate an exemplary programming procedure to program a matrix.

FIG. 16 shows a matrix circuit 160 formed of several floating-gate pFETs, which can be used to illustrate an exemplary programming procedure to program a matrix. It can be noticed that the individual terminals of these floating-gate pFETs have been pre-configured with some interconnections to one another, or to voltage sources, such as the source-bias voltage. FIG. 16 provides one example wherein the interconnections of a matrix circuit do not necessarily have to be configured using the "programmable hardware for implementing circuit interconnections" block 301 (shown in FIG. 7a). Block 301 as well as "programmable hardware for setting circuit parameters" block 302 (also shown in FIG. 7a) may be used in a selective manner to carry out other operations as will be described below.

In the exemplary circuit of FIG. 16, switches 161 and 162 may be a part of the "programmable hardware for implementing circuit interconnections" block 301, while switches 163, 164, 165, 166, 167, 168, and 169 may be a part of the "programmable hardware for setting circuit parameters" block 302. Drawing attention to switches 161 and 162 which are similar in functionality, each switch comprises a double pole configuration where the positions of the two poles are complementary to one another. This configuration permits a drain connection such as D1, to be routed out as a "Row 1 signal out" by default. When necessary, switch 161 can be operated to isolate the path to the "Row 1 signal out" terminal, and D1 may be connected to switch 163 instead.

Programming a floating-gate pFET incorporates several operations. The first step comprises selecting a particular pFET that is to be programmed. This selection process may be explained by using pFET 615 as an example. Switch 161 is activated to allow D1 to connect into switch 163. Switch 163 is activated to connect D1 into a "row 1 drain programming source" that may comprise a voltage level that permits pFET 615 to be placed in a conducting state that allows programming the floating-gate. The "row 1 drain programming source" may incorporate various voltage sources. One example voltage source may generate pulses of varying width and/or varying amplitudes to cause hot-electron injection to occur.

Switch 162 as well as other similar switches that are associated with the drain rows other than drain row 1, are activated to disconnect the rows from their respective signal output lines. Switch 164 (and other switches associated with the drain connections of other rows) is left undisturbed, thereby connecting all drain rows other than drain row 1 to a voltage source Vy. The value of Vy is selected to cause each of the pFETs (other than pFET 615) to remain in a non-conducting state.

Switch 165 is then activated to connect the gate of pFET 615 (as well as gates of other pFETs in column 1) to a "Col 1 gate programming source," which may comprise a low-voltage DC source. This low-voltage DC source may be set to an optimal injection voltage to program pFET 615. Other switches, such as switches 166 & 167 are left undisturbed, thereby connecting all the gate columns, except gate column 1, to a suitable voltage source Vz that places all pFETs other than pFET 615 in a non-programmable state.

When tunneling is to be performed for removing electrons from the floating-gate of pFET 615, switch 168 is activated to allow the floating-gate row associated with pFET 615 to connect into a "row 1 floating-gate programming source," which generate a suitable programming voltage level. Switch 165 as well as other switches associated with other floating-gate rows, are set to connect all gate rows to a voltage source that permits tunneling to occur.

Verification of accurate floating-gate programming may be carried out in several ways. One way would comprise monitoring the drain current of the pFET that was selected for programming. For example the drain current of pFET 615 may be monitored in a monitoring circuit incorporated into the "row 1 drain programming source." Alternatively, the drain current of pFET 615 may be monitored be setting switch 161 to route the drain current out via the "row 1 signal out" connection. If the monitoring circuit indicates an improper level of floating-gate charge, the programming procedure may be recursively repeated until the desired charge levels are achieved.

While the above-mentioned example explained the principles of programming a single pFET, it will be apparent to persons of ordinary skill in the art, that in alternative programming approaches, several pFETs may be selected for programming simultaneously. The selection may be carried out by appropriate control signals applied to an entire row, an entire column, multiple rows, or multiple columns. For example, in one case a selection control signal may be applied to row 3 together with a second selection signal that is applied simultaneously to column 8. In a second case a selection control signal may be applied to rows 2, 3 , 4, and 6 simultaneously, with a second selection control signal applied to column 3. This type of programming allows multiple devices of the array to be programmed simultaneously, and is particularly applicable when "global" programming of parameters, such as a reset condition, or a pre-set condition is used to bring multiple devices of an array into identical operating conditions. An example of a reset condition may comprise tunneling of several pFETs to remove floating-gate charges on the selected devices.

It should be emphasized that the above-described embodiments of the present invention are merely possible examples of implementations and are merely set forth for a clear understanding of the principles of the invention. Many variations and modifications may be made to the above-described embodiment of the invention without departing substantially from the spirit and principles of the invention. For example, while an FPAA has been used in this description merely as a convenient way to describe the principles of the invention, it will be appreciated by those skilled in that art that this invention may be implemented in circuitry outside such an integrated circuit. This may involve assembling a floating-gate pFET and its associated circuitry if any, upon a printed circuit board. This floating-gate pFET may be assembled as a discrete device rather than fabricated upon the substrate of an integrated circuit.

It may also be implemented in an integrated circuit that may not be referred to traditionally as a programmable device—for example, it may be incorporated into an application specific IC (ASIC), or a standard IC that houses other non-programmable circuitry. All such modifications and variations are intended to be included herein within the scope of the present invention and protected by the following claims.

We claim:

1. An image processing circuit comprising:
    a signal generator configured to generate a time basis signal;
    an optical sensor element comprising a differential pair of transistors and an optical sensor diode, the optical sensor element configured to receive the time basis signal and an input optical signal, and further configured to generate a differential output electrical signal that is proportional to the product of an amplitude of the time basis signal at a first instance in time and an amplitude of the input optical signal at the first instance in time;
    an analog computing element comprising a floating-gate pFET configured to perform a mathematical transform operation upon the differential output electrical signal from the optical sensor element at the first instance in time; and
    an interconnect circuit that is programmable to provide an interconnection between the differential pair of transistors and the optical sensor diode, is programmable to provide an interconnection between the differential pair of transistors and a gate terminal of the floating-gate pFET, and is further programmable to provide a floating charge in the floating-gate pFET of the analog computing element.

2. The image processing circuit of claim 1, wherein the analog computing element comprises an array of floating-gate pFETs, and wherein the floating-gate pFET is a part of the array of floating-gate pFETs.

3. The image processing circuit of claim 2, wherein the floating-gate pFET is configured to operate as an analog memory element upon providing the floating charge into the floating-gate of the floating-gate pFET.

4. The image processing circuit of claim 2, wherein the mathematical transform operation comprises multiplying the output electrical signal from the optical sensor element by a weight, and wherein the weight is proportional to the floating charge that is programmed into the floating-gate of the floating-gate pEET.

5. A cepstral processor, comprising:
- a programmable bandpass filter configured to provide a programmable frequency response to an input signal that is coupled into the programmable bandpass filter;
- a programmable peak detector that is programmed using a control voltage to provide a user-selectable frequency response;
- a programmable analog memory comprising a floating-gate pFET, the floating-gate pFET configured to provide a programmable analog memory value, the programmable analog memory communicatively coupled to the programmable bandpass filter; and
- an interconnect circuit that is programmable to provide the communicative coupling between the programmable analog memory and the programmable bandpass filter, and is further programmable to provide a floating charge in the floating-gate pFET, the floating charge being the programmable analog memory value.

6. The cepstral processor of claim 5, wherein the programmable analog memory comprises an array of floating-gate pFETs, and wherein the floating-gate pFET is a part of the array of floating-gate pFETs.

7. The cepstral processor of claim 6, wherein the floating-gate pFET is configured to operate as an analog computing element by programming a charge into the floating-gate of the floating-gate pFET.

8. The cepstral processor of claim 6, wherein the programmable bandpass filter is a capacitively coupled current conveyor circuit.

9. A programmable analog array (PAA) comprising:
- a configurable analog matrix having a first floating-gate field effect transistor (FET) and a second floating-gate FET, the configurable analog matrix being configurable to operate in one of a plurality of matrix modes; and
- an interconnect circuit that is programmable to configure the configurable analog matrix to operate in the one of a plurality of matrix modes, and wherein the interconnect circuit is further programmable to provide a floating charge in at least one of the first and second floating-gate FETs.

10. The PAA of claim 9, wherein the plurality of matrix modes comprises one of a switching matrix mode, a memory matrix mode, and a computing matrix mode.

11. The PAA of claim 10, wherein the interconnect circuit is further programmable to interconnect a first terminal of the first floating-gate FET to at least one of a first terminal of the second floating-gate FET, an input pin of the PAA, an output pin of the PAA, a voltage supply, and a ground connection.

12. The PAA of claim 11, wherein the interconnect circuit is further programmable to interconnect a gate terminal of the first floating-gate FET to one of a fixed voltage source and the ground connection for setting a floating gate charge on the first floating-gate FET.

13. The PAA of claim 10, wherein the switching matrix mode comprises at least one of the first and second floating-gate FETs operating as an analog switching element of the configurable analog matrix.

14. The PAA of claim 10, wherein the memory matrix mode comprises at least one of the first and second floating-gate FETs operating as an analog memory element of the configurable analog matrix.

15. The PAA of claim 10, wherein the computing matrix mode comprises at least one of the first and second floating-gate FETs operating as an analog computing element of the configurable analog matrix.

16. The PAA of claim 15, wherein the analog computing element provides an analog multiplication function comprising an input signal multiplied by a floating-gate charge programmed into the at least one of the first and second floating-gate FETs.

17. The PAA of claim 9, wherein the interconnect circuit comprises at least one of an analog switch, a digital switch, and a fusible link.

18. A method of configuring a programmable analog array (PAA), the method comprising:
- providing in the PAA, a configurable analog matrix having a first floating-gate field effect transistor (FET) and a second floating-gate FET, the configurable analog matrix being configurable to operate in one of a plurality of matrix modes;
- programming an interconnection between a first terminal of the first floating-gate field effect transistor (FET) and at least one of a first terminal of the second floating-gate FET, an input pin of the PAA, an output pin of the PAA, a voltage supply, and a ground connection; and
- programming an interconnection between a gate terminal of the first floating-gate FET and one of a fixed voltage source and the ground connection for setting a floating gate charge on the first floating-gate FET.

19. The method of claim 18, the method further comprising: operating the PAA in a matrix mode comprising one of a switching matrix mode, a memory matrix mode, and a computing matrix mode.

* * * * *